(12) United States Patent
Schlesener et al.

(10) Patent No.: US 9,581,910 B2
(45) Date of Patent: Feb. 28, 2017

(54) METHOD OF LITHOGRAPHICALLY TRANSFERRING A PATTERN ON A LIGHT SENSITIVE SURFACE AND ILLUMINATION SYSTEM OF A MICROLITHOGRAPHIC PROJECTION EXPOSURE APPARATUS

(71) Applicant: Carl Zeiss SMT GmbH, Oberkochen (DE)

(72) Inventors: Frank Schlesener, Oberkochen (DE); Ingo Saenger, Heidenheim (DE); Olaf Dittmann, Bopfingen (DE); Aksel Goehnermeier, Essingen-Lauterburg (DE); Alexandra Pazidis, Essingen-Lauterburg (DE); Thomas Schicketanz, Aalen (DE); Michael Patra, Oberkochen (DE); Markus Deguenther, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 14/747,441

(22) Filed: Jun. 23, 2015

(65) Prior Publication Data
US 2015/0301455 A1    Oct. 22, 2015

Related U.S. Application Data

(63) Continuation of application No. PCT/EP2013/201300, filed on Jan. 17, 2013.

(51) Int. Cl.
    *G03B 27/54*    (2006.01)
    *G03F 7/20*     (2006.01)
(52) U.S. Cl.
    CPC .............................. *G03F 7/70058* (2013.01)

(58) Field of Classification Search
    CPC ............. G03F 7/70058; G03F 7/70066; G03F 7/70075
    (Continued)

(56) References Cited

U.S. PATENT DOCUMENTS

| 5,300,971 A | 4/1994 | Kudo |
| 7,061,582 B2 | 6/2006 | Zinn et al. |

(Continued)

FOREIGN PATENT DOCUMENTS

| EP | 2 043 133 A1 | 4/2009 |
| JP | H05-226227 | 9/1993 |

(Continued)

OTHER PUBLICATIONS

International Search Report for corresponding PCT Appl No. PCT/EP2013/000118, dated Oct. 23, 2013.

(Continued)

*Primary Examiner* — Hung Henry Nguyen
(74) *Attorney, Agent, or Firm* — Fish & Richardson P.C.

(57) ABSTRACT

A method of lithographically transferring a pattern on a light sensitive surface in a multiple exposure process comprises the following steps:
a) providing a mask comprising a first mask pattern area and a second mask pattern area;
b) directing projection light on the mask, thereby producing on the light sensitive surface a first exposed pattern area, which is an image of the first mask pattern area, and a second exposed pattern area, which is an image of the second mask pattern area. The projection light illuminating the first and second mask pattern area has different angular light distributions.
c) repeating step b) using the same mask so that an image of the first mask pattern area is superimposed on the second exposure pattern area.

21 Claims, 23 Drawing Sheets

(58) Field of Classification Search
USPC .................................. 355/52, 53, 55, 67–71
See application file for complete search history.

(56) References Cited

U.S. PATENT DOCUMENTS

| | | |
|---|---|---|
| 2006/0087634 A1 | 4/2006 | Brown et al. |
| 2007/0242363 A1* | 10/2007 | Noboru ................ G02B 27/108 |
| | | 359/618 |
| 2008/0013065 A1 | 1/2008 | Kohl |
| 2009/0040490 A1* | 2/2009 | Shigematsu ........ G03F 7/70091 |
| | | 355/66 |
| 2009/0046266 A1 | 2/2009 | Nishinaga |
| 2009/0116093 A1 | 5/2009 | Tanitsu |
| 2009/0135396 A1* | 5/2009 | Mizuno ................... G03F 1/144 |
| | | 355/71 |
| 2012/0069318 A1 | 3/2012 | Goehnermeier |

FOREIGN PATENT DOCUMENTS

| | | |
|---|---|---|
| JP | H11-111601 | 4/1999 |
| JP | 2008-084338 | 4/2008 |
| JP | 2008-533728 | 8/2008 |
| WO | WO 2005/026843 A2 | 3/2005 |
| WO | WO 2006/097135 A1 | 9/2006 |
| WO | WO 2008/001593 | 1/2008 |
| WO | WO 2010/006687 A1 | 1/2010 |
| WO | WO 2012/028158 | 3/2012 |
| WO | WO 2012/089224 | 7/2012 |
| WO | WO 2012/100791 | 8/2012 |

OTHER PUBLICATIONS

Japanese Office Action, with translation thereof, for corresponding JP Appl No. 2015-553012 , dated May 19, 2016.

\* cited by examiner

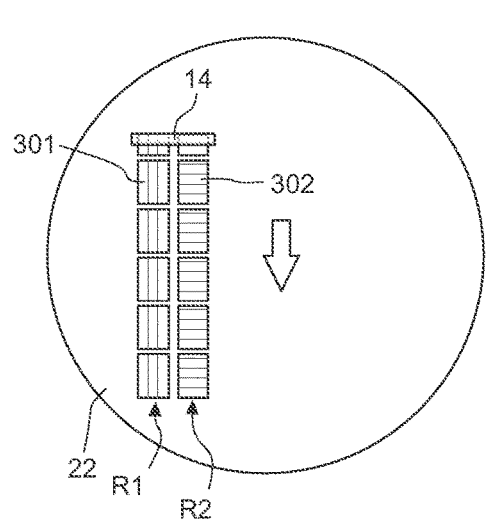
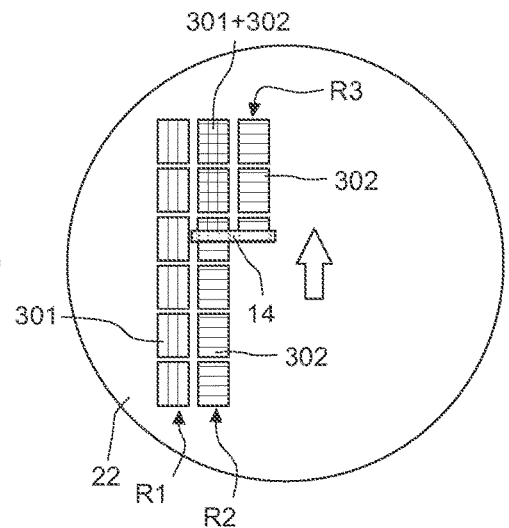
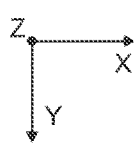
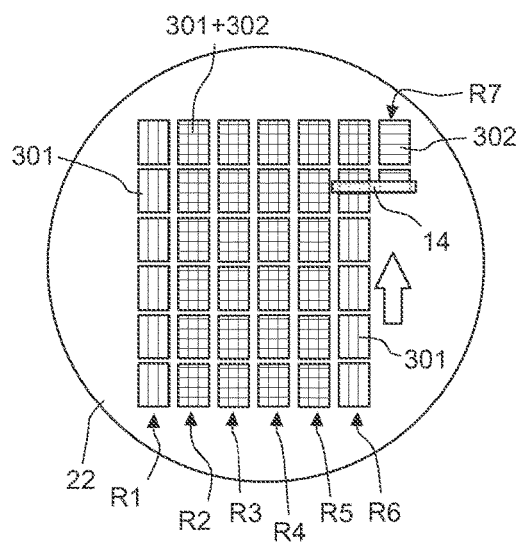
Fig. 3a
Fig. 3b
Fig. 3c

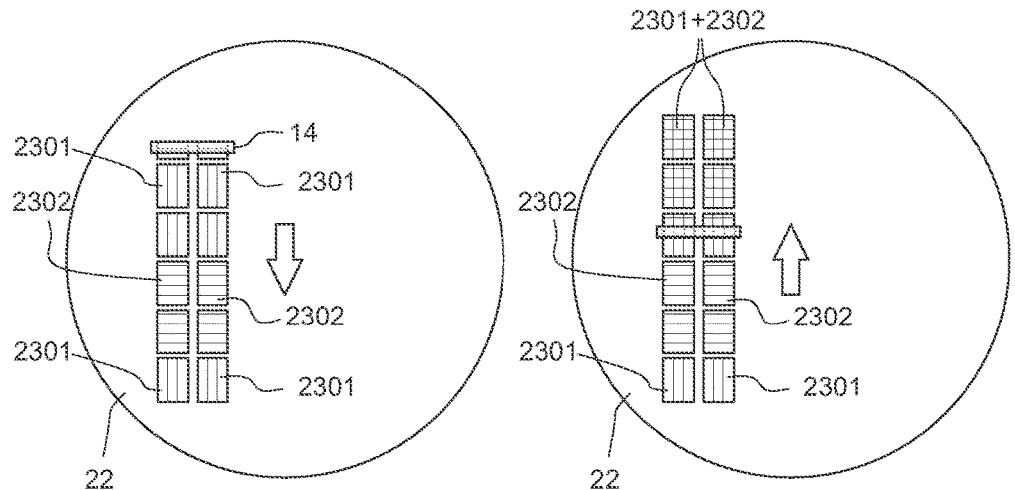
Fig. 5a    Fig. 5b
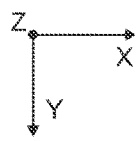
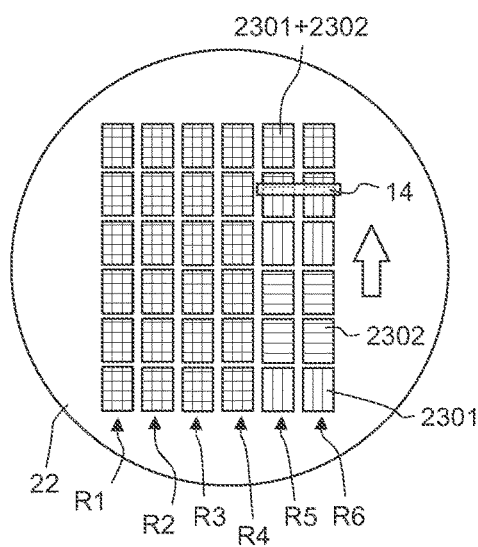
Fig. 5c

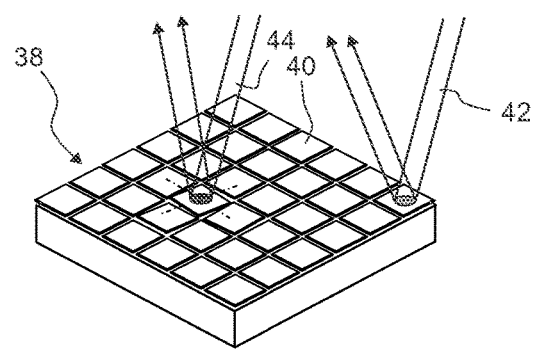
Fig. 9
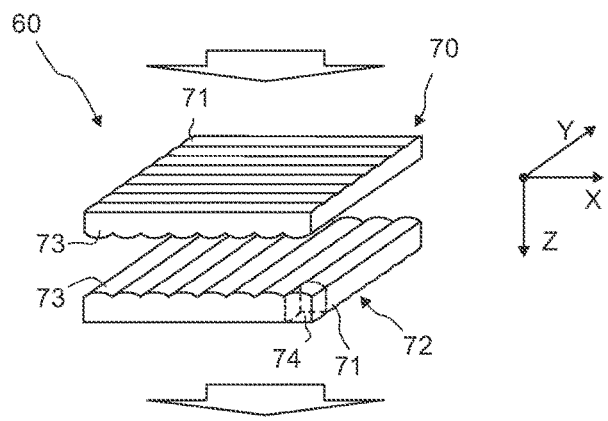
Fig. 10
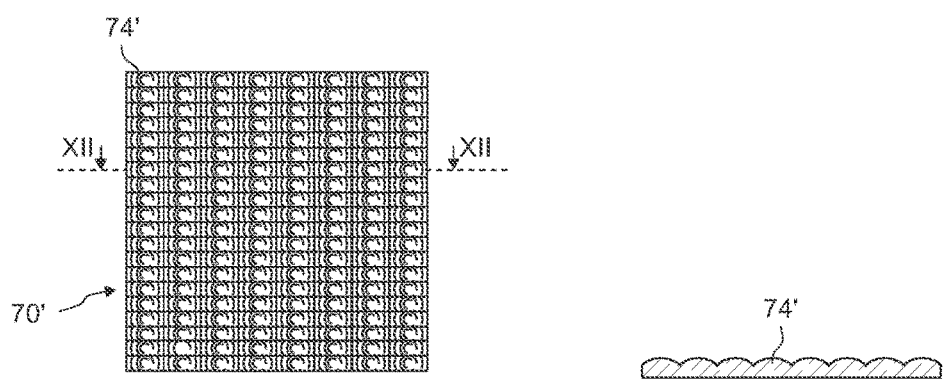
Fig. 11
Fig. 12

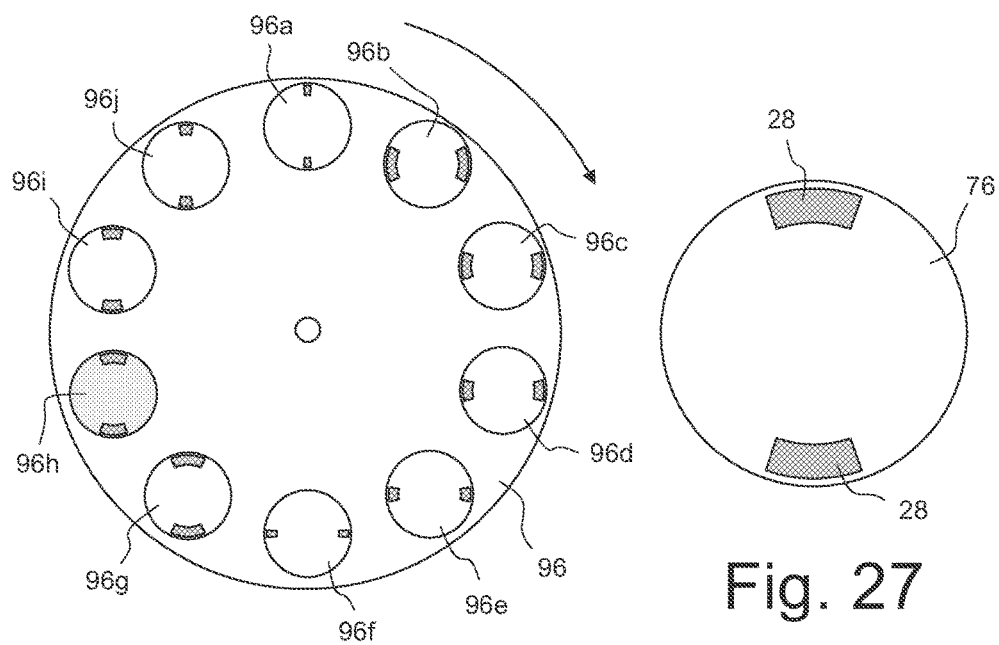
Fig. 26
Fig. 27
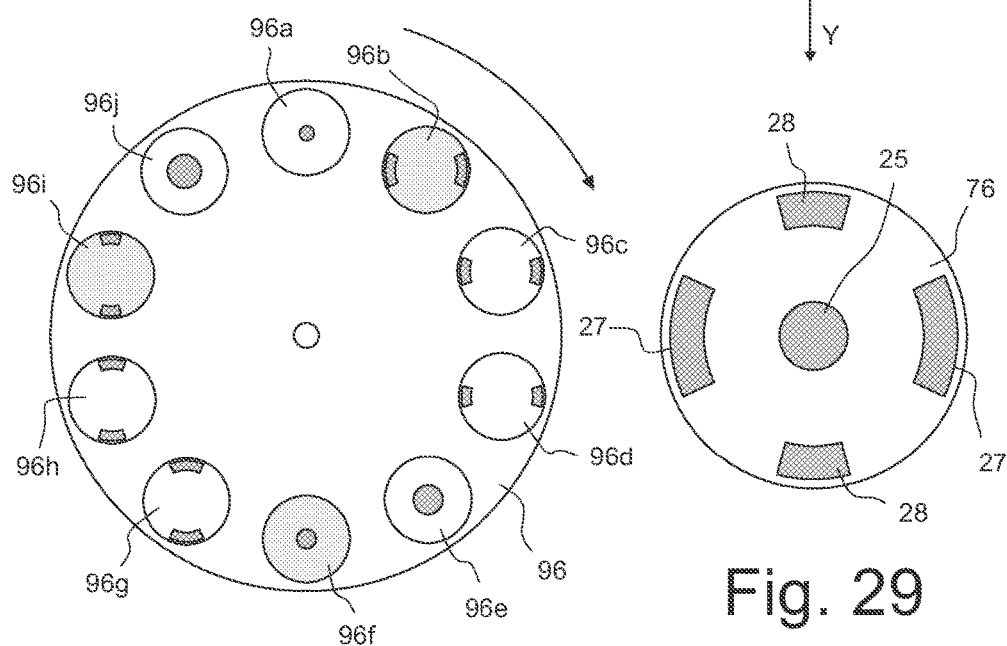
Fig. 28
Fig. 29

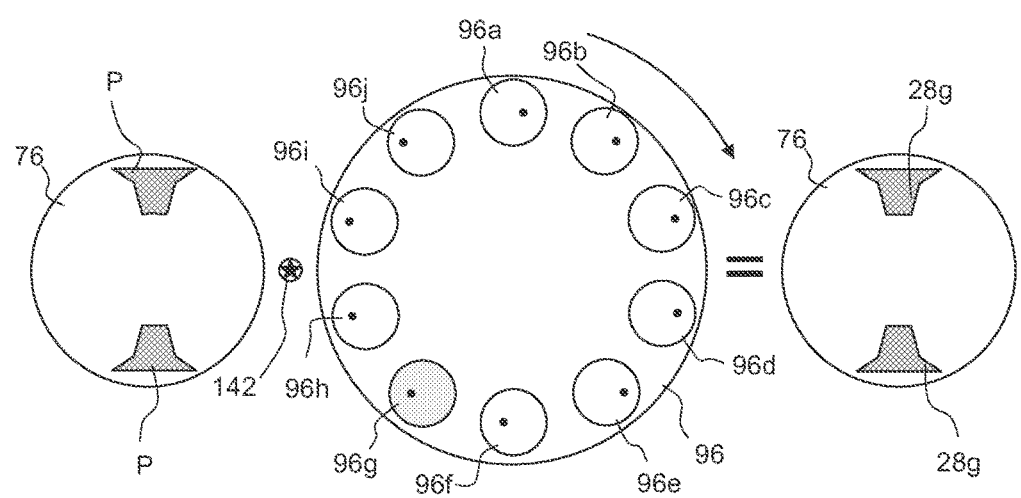
Fig. 37a  Fig. 37b  Fig. 37c
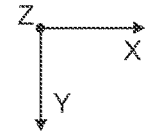
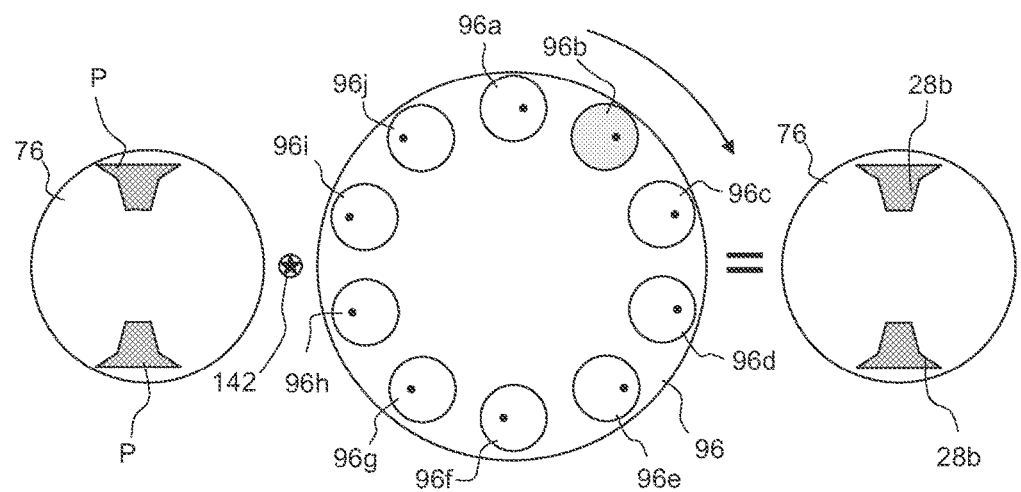
Fig. 38a  Fig. 38b  Fig. 38c

METHOD OF LITHOGRAPHICALLY TRANSFERRING A PATTERN ON A LIGHT SENSITIVE SURFACE AND ILLUMINATION SYSTEM OF A MICROLITHOGRAPHIC PROJECTION EXPOSURE APPARATUS

CROSS-REFERENCE TO RELATED APPLICATIONS

The present application is a continuation of, and claims benefit under 35 USC 120 to, international application PCT/EP2013/000118, filed Jan. 17, 2013. The entire disclosure of this application is incorporated by reference herein.

BACKGROUND OF THE INVENTION

1. Field of the Invention

The invention generally relates to microlithographic exposure apparatus, and in particular to a method of lithographically transferring a pattern on a light sensitive surface and to an illumination system of such an apparatus.

2. Description of Related Art

Microlithography (also called photolithography or simply lithography) is a technology for the fabrication of integrated circuits, liquid crystal displays and other microstructured devices. The process of microlithography, in conjunction with the process of etching, is used to pattern features in thin film stacks that have been formed on a substrate, for example a silicon wafer. At each layer of the fabrication, the wafer is first coated with a photoresist which is a material that is sensitive to radiation, such as deep ultraviolet (DUV) light. Next, the wafer with the photoresist on top is exposed to projection light in a projection exposure apparatus. The apparatus projects a mask containing a pattern onto the photoresist so that the latter is only exposed at certain locations which are determined by the mask pattern. After the exposure the photoresist is developed to produce an image corresponding to the mask pattern. Then an etch process transfers the pattern into the thin film stacks on the wafer. Finally, the photoresist is removed. Repetition of this process with different masks results in a multi-layered microstructured component.

A projection exposure apparatus typically includes an illumination system for illuminating the mask, a mask stage for aligning the mask, a projection objective and a wafer alignment stage for aligning the wafer coated with the photoresist. The illumination system illuminates a field on the mask that may have the shape of a rectangular or curved slit, for example.

In current projection exposure apparatus a distinction can be made between two different types of apparatus. In one type each target portion on the wafer is irradiated by exposing the entire mask pattern onto the target portion in one go. Such an apparatus is commonly referred to as a wafer stepper. In the other type of apparatus, which is commonly referred to as a step-and-scan apparatus or scanner, each target portion is irradiated by progressively scanning the mask pattern under the projection beam along a scan direction while synchronously moving the substrate parallel or anti-parallel to this direction. The ratio of the velocity of the wafer and the velocity of the mask is equal to the magnification of the projection objective, which is usually smaller than 1, for example 1:4.

It is to be understood that the term "mask" (or reticle) is to be interpreted broadly as a patterning means. Commonly used masks contain transmissive or reflective patterns and may be of the binary, alternating phase-shift, attenuated phase-shift or various hybrid mask type, for example. However, there are also active masks, e.g. masks realized as a programmable mirror array. Also programmable LCD arrays may be used as active masks.

As the technology for manufacturing microstructured devices advances, there are ever increasing demands also on the illumination system. Ideally, the illumination system illuminates each point of the illuminated field on the mask with projection light having a well defined irradiance and angular distribution. The term angular distribution describes how the total light energy of a light bundle, which converges towards a particular point in the mask plane, is distributed among the various directions of the rays that constitute the light bundle.

The angular distribution of the projection light impinging on the mask is usually adapted to the kind of pattern to be projected onto the photoresist. For example, relatively large sized features may require a different angular distribution than small sized features. The most commonly used angular distributions of projection light are referred to as conventional, annular, dipole and quadrupole illumination settings. These terms refer to the irradiance distribution in a pupil plane of the illumination system. With an annular illumination setting, for example, only an annular region is illuminated in the pupil plane. Thus there is only a small range of angles present in the angular distribution of the projection light, and thus all light rays impinge obliquely with similar angles onto the mask.

If a mask pattern to be imaged on the photo resist comprises portions that look very different with respect to structure orientation, density and/or pitches, there is usually no specific angular light distribution that is perfectly suited to image all mask pattern areas with an optimum image quality. For example, if there is a first mask pattern area comprising features that extend along the X direction and a second mask pattern area which comprises features extending to an orthogonal Y direction, a quadrupole or C-quad illumination setting images all features with the same, but sub-optimum image quality. This is because only two poles contribute to the image formation of each feature, whereas the other two poles contribute to background illumination, which results in a reduced contrast. Ideally, the features extending along the X direction would be illuminated exclusively with a Y dipole illumination setting, and the features extending along the Y direction would be illuminated with an X dipole illumination setting.

Such an improved illumination, and hence improved imaging, can be achieved if the pattern is not transferred on the light sensitive surface in one go, but in two (or more) separate exposures using different photo masks. The first mask comprises all features extending along the X direction and is illuminated with a Y dipole illumination setting. The second mask comprises the features extending along the Y direction and is illuminated in a subsequent exposure with an X dipole illumination setting. This approach to distribute the imaging of complex patterns among two separate exposures is usually referred to as "double exposure". If this approach is extended to more than two subsequent exposures, it is referred to as multiple exposure.

Since the mask can be exchanged quickly, the illumination system has to be capable of changing the angular light distribution at mask level quickly, too.

Different means are known in the art to modify the angular distribution of the projection light in the mask plane so as to achieve the desired illumination setting. In the simplest case a stop (diaphragm) comprising one or more apertures is positioned in a pupil plane of the illumination system. Since locations in a pupil plane translate into angles in a Fourier related field plane such as the mask plane, the size, shape and location of the aperture(s) in the pupil plane determines the angular light distribution at mask plane level. However, any change of the illumination setting requires a replacement of the stop. This makes it difficult to finely adjust the illumination setting, because this would require a very large number of stops that have aperture(s) with slightly different sizes, shapes or locations. Furthermore, the use of stops inevitably results in light losses which reduce the throughput of the apparatus.

Many common illumination systems therefore comprise adjustable elements that make it possible, at least to a certain extent, to continuously vary the illumination of the pupil plane.

The most common approach is to use a diffractive optical element that defines the irradiance distribution in the pupil plane. A diffractive optical element can be manufactured such that almost any arbitrary far field irradiance distribution can be produced. Often such diffractive optical elements are realized as computer generated holograms (CGH). For being able to change the irradiance distribution in the pupil plane, a plurality of different diffractive optical elements may be received in an exchange holder so that one of these diffractive optical elements may be inserted quickly into the light path of the projection light. Such an exchange holder may be a linear exchange holder or a turret holder which is capable of rotating around a rotational axis, for example.

The irradiance distribution in the pupil plane defined by the diffractive optical element may be modified additionally with the help of a zoom optical system and a pair of axicon elements. By displacing lenses of the zoom optical system and/or the axicon elements along the optical axis, the irradiance distribution can be modified continuously within certain limits.

However, the exchange of diffractive optical elements and the displacement of lenses and other optical elements along the optical axis is a relatively slow process and may thus limit the throughput of the apparatus.

A more flexible and quicker approach to produce different irradiance distributions in the pupil plane of the illumination system is the use of mirror arrays instead of diffractive optical elements.

In EP 1 262 836 A1 the mirror array is realized as a micro-electromechanical system (MEMS) comprising more than 1000 microscopic mirrors. Each of the mirrors can be tilted in two different planes perpendicular to each other. Thus radiation incident on such a mirror device can be reflected into (substantially) any desired direction of a hemisphere. A condenser lens arranged between the mirror array and the pupil plane translates the reflection angles produced by the mirrors into locations in the pupil plane. This known illumination system makes it possible to illuminate the pupil plane with a plurality of spots, wherein each spot is associated with one particular microscopic mirror and is freely movable across the pupil plane by tilting this mirror.

Similar illumination systems are known from US 2006/0087634 A1, U.S. Pat. No. 7,061,582 B2 and WO 2005/026843 A2.

The illumination system disclosed in WO 2010/006687 A1 uses a mirror array not only to determine the angular, but also the spatial irradiance distribution in the mask plane. To this end the mirror produces spots being so small that different light patterns can be produced on the light entrance facets of the optical integrator. Since these light entrance facets are optically conjugate with the mask plane, a particular light pattern produced on a light entrance facet is directly imaged on the mask plane. This ability to vary the geometry of the field which is illuminated in the mask plane can be used to eliminate the need for adjustable blades in the illumination system. Such blades are used in apparatus of the scanner type at the beginning and the end of each scanning cycle to enlarge or to reduce the illuminated field along the scan direction. It is also described that, at a given instance, different light entrance facets may be illuminated with different light patterns so as to produce a spatial irradiance distribution having a smooth profile.

Also unpublished international patent application PCT/EP2011/000416 discloses an illumination system which is capable to produce at a given instance during a scan process different angular light distributions at different portions on the mask. This is again accomplished by producing different light patterns on the light entrance facets of the optical integrator.

According to unpublished international patent application PCT/EP2010/005317 different angular light distributions at different portions on the mask can be produced with the help of a plurality of modulator units that are arranged in the vicinity of the optical integrator. Each modulator unit is associated with a single optical channel of the optical integrator and variably redistributes, without blocking any light, a spatial and/or angular light distribution of the respective optical channel.

WO 2006/097135 A1 discloses an illumination system which is capable to change very quickly, for example between successive pulses of a pulse train emitted by the light source, the angular light distribution at mask level. This may be accomplished by alternately shielding certain portions of the pupil plane by a rotating diaphragm, by using an LCD transmission filter in the pupil plane or by using the acousto-optic effect in a diffractive optical element, for example. The state of polarization can be changed simultaneously with the angular light distribution with the help of a quickly rotating polarizing element.

US 2008/0013065 A1 discloses an illumination system which is also capable to change very quickly the angular light distributions at mask level. To this end the illumination system comprises a first and a second pupil defining unit each including a diffractive optical element, a zoom optical system and a pair of axicon elements. Projection light is either guided through the first or the second pupil defining unit using suitable light switching components, before it impinges on an optical integrator.

When double (or generally multiple) exposures are performed, overlay errors are a crucial issue. The term overlay error originally related to the registration of adjacent pattern layers in the micro-structured devices. If features that should be arranged one above the other are laterally displaced, this offset is referred to as overlay error. Meanwhile the term overlay error is also used to denote relative displacements of features within a single layer, as this may happen in layers which have been structured in a double exposure process. Many microstructured devices are more sensible to overlay errors within single layers than to overlay errors between adjacent layers. For that reason the overlay error budget within single layers produced in a double exposure process is often particularly small. Exceeding the tight specifications reduces drastically the yield of the manufacturing process. For that reason double exposure is still not as widely used as it could be with regard to the obvious advantages which are associated with illuminating the features with projection light having an optimum angular light distribution.

One significant cause of overlay errors in double exposure processes is associated with the fact that the images of two different masks are superimposed. Then not only alignment errors of the two masks contribute to the overlay error budget, but also manufacturing tolerances that are inevitable when the two masks are fabricated. The fabrication of a mask is a very sophisticated process, and therefore the conditions that prevailed when one mask has been manufactured cannot be perfectly reproduced during the fabrication of the other mask. In other words, even if alignment errors during the second exposure could be reduced to zero, there would still be a significant overlay error because the two masks do not perfectly correspond to one another.

SUMMARY OF THE INVENTION

It is therefore an object of the present invention to provide a method of lithographically transferring a pattern on a light sensitive surface in a multiple exposure process in which overlay errors are reduced.

In accordance with the present invention, this object is achieved by a method comprising the following steps:
a) providing a mask comprising a first mask pattern area and a second mask pattern area;
b) directing projection light on the mask, thereby producing on the light sensitive surface a first exposed pattern area, which is an image of the first mask pattern area, and a second exposed pattern area, which is an image of the second mask pattern area;
c) repeating step b) using the same mask so that an image of the first mask pattern area is superimposed on the second exposure pattern area;
wherein the projection light illuminating the first mask pattern area has a first angular light distribution, and the projection light illuminating the second mask pattern area has a second angular light distribution which is different from the first angular light distribution.

The invention is based on the conception that overlay errors can be significantly reduced if a multiple exposure process is not performed with two or more different masks, but with a single mask only. This requires that different mask pattern areas are illuminated with projection light having different angular light distributions which are adapted to the specific mask pattern areas. In other words, the two different masks that are conventionally used in double exposure processes are combined in a single mask which is therefore used for both exposures. In this way one significant contribution to overlay errors, namely manufacturing tolerances during the fabrication of two masks, is eliminated, because all mask pattern areas are fabricated in a single fabrication process.

For example, if minute scale variations occur during the mask fabrication, two different masks may slightly differ with respect to their scale, and this will inevitably result in overlay errors if the two masks are used in a double exposure process. In accordance with the invention, the different mask pattern areas will necessarily have the same scale, and thus scale variations cannot compromise the overlay of the features in a single layer.

Also with the invention, each mask pattern area may be illuminated with the optimum illumination setting. In other words, the first angular light distribution will usually be adapted to the first mask pattern area, and the second angular light distribution will be adapted to the second mask pattern area. Thus the first and second mask pattern areas are in fact designed in the same manner as the two different masks in a conventional double (or generally multiple) exposure process.

The first and second angular light distributions may be associated with an illumination setting which is included in the group consisting of: conventional illumination setting, annular illumination setting and multipole illumination setting. The multipole illumination setting may be included in the group consisting of: scan direction dipole illumination setting, cross scan direction dipole illumination setting, quadrupole illumination setting, Cquad illumination setting.

The projection light having different angular light distributions may be directed on the first mask pattern area and the second mask pattern area either simultaneously or successively during step b). The former case implies that the illumination system has to be capable of producing simultaneously projection light having different angular light distributions at different portions of the field which is illuminated on the mask. Illumination systems which are capable of producing a field dependent angular light distribution are known in the art as such. In this context reference is made to unpublished international patent applications PCT/EP2011/000416 and PCT/EP2010/005317 which have both been briefly discussed further above.

If the first and second mask pattern areas are produced simultaneously during step b) with projection light having different angular light distributions, and if the mask moves along a scan direction during step b) so that an illuminated field scans over the first mask pattern area and the second mask pattern area, the first mask pattern area and the second mask pattern area may be arranged side by side along a cross scan direction which is perpendicular both to the scan direction and to a normal on the mask.

The simplest approach for superimposing an image of the first mask pattern area on the second exposure pattern area is then to displace the light sensitive surface laterally between steps b) and c) by a suitable displacement, for example by one half of the length of the illuminated field along the cross scan direction. Similar considerations apply for an apparatus of the wafer stepper type.

A more complicated approach would be to rotate the mask by 180° about a normal on the mask, before the second exposure is performed. Then it is possible to superimpose during step c) not only an image of the first mask pattern area on the second exposure pattern area, but also and simultaneously an image of the second mask pattern area on the first exposure pattern area.

If the projection light is first directed on the first mask pattern area and subsequently on the second mask pattern area during step b), the illumination system has to be capable of changing the angular light distribution very quickly during the exposure process. Illumination systems which are capable to do this are known from WO 2006/097135 and US 2008/0013065 A1 which have also been briefly discussed further above.

Also this approach may be performed with a wafer stepper, too. Then, for example, a first row may be produced with alternating first and second exposed pattern areas. After that a second exposure is performed, in which the image of the other mask pattern area is superimposed on the respective exposed pattern area.

If the mask moves along a scan direction during step b) so that an illuminated field scans over the first mask pattern area and the second mask pattern area, the first mask pattern area and the second mask pattern area may be arranged one behind the other along the scan direction on the mask. Then it is possible that not only an image of the first mask pattern area will be superimposed on the second exposure pattern area during step c), but also an image of the second mask pattern area will be superimposed on the first exposure pattern area.

The above described approach of performing a double exposure using one and the same mask may be easily extended to multiple exposures. For example, the mask may comprise additionally a third mask pattern area, and an image of the third mask pattern area may be superimposed on the first exposure pattern area and on the second exposure pattern area, wherein the projection light illuminating the third mask pattern area has a third angular light distribution which is different from the first angular light distribution and from the second angular light distribution. Similar to the embodiments described above, the projection light may be directed simultaneously or successively on the first, second and third mask pattern areas during step b).

Similarly, the mask may comprise additionally a fourth mask pattern area, and an image of the fourth mask pattern area may be superimposed on the first exposure pattern area, on the second exposure pattern area and on the third exposure pattern area, wherein the projection light illuminating the fourth mask pattern area has a fourth angular light distribution which is different from the first angular light distribution, from the second angular light distribution and from the third angular light distribution.

One approach to superimpose the images of all four mask pattern areas on the light sensitive surface may imply, simultaneously to producing the first exposed pattern area during step b), to produce the second exposed pattern area on the light sensitive surface. Simultaneously to producing a third exposed pattern area, which is an image of the third mask pattern area, a fourth exposed pattern area, which is an image of the fourth mask pattern area, is produced on the light sensitive surface. Simultaneously to superimposing an image of the third mask pattern area on the first exposure pattern area during step c), thereby producing a combined first plus third mask pattern area, an image of the fourth mask pattern area on the second exposed pattern area is superimposed, thereby producing a combined second plus forth mask pattern area. In a further step d), alternately an image of the first mask pattern area is superimposed on the combined second plus forth mask pattern area, thereby producing a combined first plus second plus forth mask pattern area, and an image of the third mask pattern area is superimposed on the combined second plus forth mask pattern area, thereby producing a combined second plus third plus forth mask pattern area. In a further step d) alternately an image of the first mask pattern area is superimposed on the combined second plus third plus forth mask pattern area, thereby producing a combined first plus second plus third plus forth mask pattern area, and an image of the third mask pattern area is superimposed on the combined first plus second plus forth mask pattern area, thereby producing further first plus second plus third plus forth mask pattern areas.

It is to be noted that the method in accordance with the present invention may be equally used in exposure apparatus using a light source that produces deep ultraviolet light (DUV), vacuum ultraviolet light (VUV) or extreme ultraviolet light (EUV).

An illumination system which is capable of changing the angular light distribution very quickly may comprise, in accordance with the present invention, a light source which is configured to emit a train of successive projection light pulses, wherein the pulse train has an average pulse frequency f>1 kHz. The illumination system further comprises a pupil plane and a diffractive optical element comprising a first portion and a second portion. The first portion produces, if illuminated by the light pulses, a first irradiance distribution in the pupil plane. The second portion produces, if illuminated by the light pulses, a second irradiance distribution in the pupil plane which is different from the first irradiance distribution. A drive is provided which is configured to rotate the diffractive optical element around a rotational axis. In a first rotational position of the diffractive optical element the first portion is illuminated by the light pulses, and in a second rotational position of the diffractive optical element, which is different from the first rotational position, the second portion is illuminated by the light pulses. A control unit is provided that is configured to control the light source such that a change between the first rotational position and the second rotational position takes place between two light pulses of the pulse train, and preferably between 5 successive light pulses of the pulse train, and more preferably between two successive light pulses.

The illumination system of this invention is based on the perception that it is possible to rotate a diffractive optical element, which may have the shape of a disk or a ring, for example, around a rotational axis very quickly, but nevertheless with a high angular accuracy, so that a certain portion of the diffractive optical element will be exactly at a desired rotational position at predetermined times. Then the different portions of the diffractive optical element will be positioned within the beam path of the light pulses so frequently that it is possible to select the desired portion simply by suitably synchronizing the emission of light pulses with the rotation of the diffractive optical element.

In principle it could be considered to emit the light pulses perfectly regularly so that the time interval between two successive light pulses is always equal during a scan cycle. Then, however, it would be necessary to change the angular velocity of the diffractive optical element if the illumination setting shall change. Since this is difficult to accomplish, and in particular between two successive light pulses of a pulse train, the angular velocity of the diffractive optical element is preferably, in accordance with the present invention, kept constant. The control unit is then configured to modify the emission time of individual light pulses within a single pulse train by a time shift of at least $\frac{1}{10}f$, preferably $\frac{1}{5}f$ and even more preferably $\frac{1}{2}f$, so that a particular light pulse illuminates, depending on the time shift, either the first or the second portion while the diffractive optical element rotates around the rotational axis with constant angular velocity. In this manner it is possible to select the desired irradiance distribution in the pupil plane by simply shifting light pulses in the time domain by a certain amount so that the light pulse impinges on the diffractive optical element right at that moment when the portion of the diffractive optical element is inserted in the light path that produces the desired irradiance distribution.

Assuming typical dimensions of the projection light beam that illuminates the rotating diffractive optical element and pulse frequencies f>1 kHz, the drive may be configured to rotate the diffractive optical element such that its circumference moves with a tangential velocity of more than 10 m/s, preferably of more than 100 m/s and even more preferably of more than 200 m/s. Even ultrasonic velocities may be required if the pulse frequency is high and the cross section of the projection light beam is large when it impinges on the diffractive optical element.

In some embodiments the rotational frequency of the diffractive optical element is equal to the average pulse frequency f. Then the time between two successive light pulses suffices (at least in the average) for a complete rotation of the diffractive optical element.

As mentioned above, it is generally preferred if the change between the first rotational position and the second rotational position takes place between two successive light pulses of the pulse train. However, it is also possible to waste a small number of light pulses between a change of the rotational positions. The wasted light pulses may impinge on an absorptive area of a rotating support that carries the diffractive optical element, for example. Allowing a certain number of light pulses to be wasted provides additional time for changing the rotational positions.

The diffractive optical element may also comprise a plurality of first portions and a plurality of second portions, wherein each first portion produces, if illuminated by the light pulses, a first irradiance distribution in the pupil plane, and each second portion produces, if illuminated by the light pulses, a second irradiance distribution in the pupil plane which is different from the first irradiance distribution. If then the first portions and the second portions alternate along a circumference of the diffractive optical element, it is possible to reduce the angular frequency of the diffractive optical element. For example, if the diffractive optical element comprises n>2 first portions and n>2 second portions, the rotational frequency of the diffractive optical element may be reduced to f/n.

As a matter of course, the diffractive optical element may also comprise m, with m=3, 4, 5, . . . , portions, wherein each of the m portions produces, if illuminated by the light pulses, an irradiance distribution in the pupil plane which is different from an irradiance distribution which is produced in the pupil plane by any of the other portions.

In other embodiments the control unit is configured to control the drive and/or light source such that the first portion and the second portion are illuminated by the light pulses during a single rotation of the diffractive optical element by 360°. Then two different irradiance distributions are produced in the pupil plane alternately, which finally results in a scan integrated illumination setting which is a combination of the two illumination settings that are associated with the first and second portion of the diffractive optical element.

The first portion and the second portion may be included in a circular ring which is centered with respect to the rotational axis. If the diffractive effect produced by the ring changes, if illuminated by the light pulses, continuously during a rotation of the diffractive optical element, it is possible to finely adjust the irradiance distribution in the pupil plane by carefully changing the emission time of the light pulses.

In one embodiment the illumination system comprises a stationary diffractive optical element, which is fixedly arranged such that the irradiance distribution in the pupil plane is at least substantially a convolution of the irradiance distribution produced by the stationary diffractive optical element and the first or the second irradiance distribution produced by the first and the second portion, respectively.

This is particularly advantageous if the stationary diffractive optical element produces the basic configuration of the irradiance distribution in the pupil plane. The different portions of the rotating diffractive optical element may then be used to modify this irradiance distribution. The modification may include the change of the position and/or size of the irradiance distribution or portions thereof in the pupil plane. In this manner it is possible to variably adjust the telecentricity or pole balance of the illumination setting defined by the stationary diffractive optical element, for example.

The use of a stationary diffractive optical element makes it also possible to use a first and a second light source each being configured to emit a train of successive projection light pulses having an average pulse frequency f>1 kHz. The light pulses produced by the first and second light sources impinge from the different directions either on the stationary or the quickly rotating diffractive optical element. The first and second portion of the rotating diffractive optical element may then be configured to tilt the light beams, which impinge obliquely on one of the diffractive optical elements. Thus the tilt associated with the oblique incidence is compensating for by the quickly rotating diffractive optical element.

If the first and second light sources are configured to emit light pulses alternately, it is possible to obtain an effective pulse train having an average pulse frequency of 2f.

It is also possible to use light sources having different average pulse frequencies. Then other arrangements of the first and second portions of the diffractive optical element are necessary.

Subject of the present invention is also a method of operating a microlithographic projection exposure apparatus comprising the following steps:
a) producing a train of successive projection light pulses with an average pulse frequency f>1 kHz;
b) simultaneously rotating a diffractive optical element around a rotational axis (preferably with a constant angular velocity), the diffractive optical element comprising a first portion and a second portion, wherein the first portion produces, if illuminated by the light pulses, a first irradiance distribution in a pupil plane of the illumination system, and wherein the second portion produces, if illuminated by the light pulses, a second irradiance distribution in the pupil plane which is different from the first irradiance distribution;
c) controlling an emission of the light pulses in step a) and/or a rotation of the diffractive optical element in step b) such that one light pulse illuminates the first portion and another, preferably an immediately successive, light pulse of the same pulse train illuminates the second portion.

The above remarks concerning the illumination system of the present invention apply here, mutatis mutandis, as well.

In particular, the diffractive optical element may be rotated around the rotational axis with a constant angular velocity, and the emission times of the light pulses may be modified within a single pulse train by a time shift of at least $\frac{1}{10}$ f, preferably at least $\frac{1}{5}$ f, even more preferably by at least $\frac{1}{2}$ f, so that a particular light pulse illuminates, depending on the time shift, either the first or the second portion while the diffractive optical elements rotate around the rotational axis with constant angular velocity.

The circumference of the diffractive optical element may move the tangential velocity of more than 10 m/s, preferably more than 100 m/s, and more preferably more than 200 m/s. The emission time may be controlled such that the first portion and the second portion are illuminated alternately during a single pulse train.

The first portion and the second portion may laterally shift an irradiance distribution which is produced by the stationary diffractive optical element in the pupil plane, along opposite directions so as to compensate telecentricity errors, for example.

The light pulses may pass additionally through a stationary diffractive optical element which is fixedly arranged such that the irradiance distribution in the pupil plane is at least substantially a convolution of the irradiance distribution produced by the stationary diffractive optical element in the first or the second irradiance distribution produced by the first and second portion, respectively.

The train of light pulses may be produced by a first light source, which emits a first train of successive projection light pulses, and a second light source, which emits a second train of successive projection light pulses, wherein the first pulse train and the second pulse train are interleaved.

The first portion may be illuminated only by light pulses of the first pulse train, wherein the second portion is illuminated only by light pulses of the second pulse train. The first portion and the second portion then compensate a tilt of projection light pulses that impinge from the first and second light source from different directions on one of the diffractive optical elements. The one diffractive optical element is preferably the stationary diffractive optical element.

Furthermore, the first and second light source may be configured to emit light pulses alternately so that an effective pulse train having an average pulse frequency of 2f is obtained.

According to another aspect of the invention, an illumination system of a microlithographic projection exposure apparatus is provided which comprises an optical integrator comprising an array of optical raster elements. A light beam is associated with each optical raster element. A condenser is provided which superimposes the light beams associated with the optical raster elements in a common field plane, which is identical to or optically conjugate to a mask plane in which a mask to be illuminated is positioned during operation of the illumination system. The illumination system further comprises a polarization modulator which is configured to modify a field dependency of a state of polarization of projection light in an illuminated field, which is illuminated in the mask plane by the illumination system.

With such a polarization modulator it is possible to illuminate different portions of the illuminated field at a given time with projection light having different states of polarization. If these states of polarization are carefully adapted to the size and orientation of the features to be imaged on a light sensitive surface, an improved imaging quality will be obtained.

In one embodiment the polarization modulator comprises a plurality of modulator units. Each modulator unit is arranged in a raster field plane, which comprises a plurality of raster field plane elements. Each raster field plane element is imaged on the entire common field plane and is associated in a one to one correspondence with one of the optical raster elements. The modulator units are configured to variably modify the state of polarization of the light beams, which are associated with the optical raster elements, differently in at least two portions of each raster field plane element in response to a control signal.

In one embodiment the illumination system comprises a control unit which is capable of controlling the modulator units in such a manner that different states of polarization are present in the illuminated field.

In one embodiment each modulator unit comprises two birefringent optical components having a thickness along an optical axis of the illumination system that is individually variable. Then the optical effect of the birefringent optical component may be changed between the optical effect produced by a quarter-wave plate and a half-wave plate, for example.

If each optical component comprises two birefringent wedges and a drive which is configured to displace at least one wedge, the thickness of the optical components can be easily changed by changing the relative position of the birefringent wedges.

Subject of the present invention is also a method of illuminating a mask in a microlithographic projection exposure apparatus comprising the following steps:
a) illuminating a first mask pattern area with first projection light having a first state of polarization, while the mask moves along a scan direction;
b) illuminating a second mask pattern area, which is arranged on the mask next to the first mask pattern area along a cross scan direction which is perpendicular to the scan direction, with second projection light having a second state of polarization, which is different from the first state of polarization.

The first projection light may have a first angular light distribution, and the second projection light may have a second angular light distribution which is different from the first angular light distribution.

The first state of polarization may be changed to a third state of polarization, which is different from the second state of polarization, for example after a movement of the mask along a scan direction has been terminated.

DEFINITIONS

The term "light" is used herein to denote any electromagnetic radiation, in particular visible light, UV, DUV and VUV and EUV light and X-rays.

The term "light ray" is used herein to denote light whose path of propagation can be described by a line.

The term "light bundle" is used herein to denote a plurality of light rays that have a common origin in a field plane.

The term "light beam" is used herein to denote light that passes through a particular lens or another optical element.

The term "position" is used herein to denote the location of a reference point of a body in the three-dimensional space. The position is usually indicated by a set of three Cartesian coordinates. The orientation and the position therefore fully describe the placement of a body in the three-dimensional space.

The term "surface" is used herein to denote any plane or curved surface in the three-dimensional space. The surface may be part of a body or may be completely separated therefrom, as it is usually the case with a field or a pupil plane.

The term "field plane" is used herein to denote a plane that is optically conjugate to the mask plane.

The term "pupil plane" is used herein to denote a plane in which marginal rays passing through different points in the mask plane intersect. As usual in the art, the term "pupil plane" is also used if it is in fact not a plane in the mathematical sense, but is slightly curved so that, in the strict sense, it should be referred to as pupil surface.

The term "uniform" is used herein to denote a property that does not depend on the position.

The term "optical raster element" is used herein to denote any optical element, for example a lens, a prism or a diffractive optical element, which is arranged, together with other identical or similar optical raster elements so that each optical raster element is associated with one of a plurality of adjacent optical channels.

The term "optical integrator" is used herein to denote an optical system that increases the product NA·a, wherein NA is the numerical aperture and a is the illuminated field area.

The term "condenser" is used herein to denote an optical element or an optical system that establishes (at least approximately) a Fourier relationship between two planes, for example a field plane and a pupil plane.

The term "conjugated plane" is used herein to denote planes between which an imaging relationship is established. More information relating to the concept of conjugate planes are described in an essay E. Delano entitled: "First-order Design and the y, $\bar{y}$ Diagram", Applied Optics, 1963, vol. 2, no. 12, pages 1251-1256.

The term "field dependency" is used herein to denote any functional dependency of a physical quantity from the position in a field plane.

The term "spatial irradiance distribution" is used herein to denote how the total irradiance varies over a real or imaginary surface on which light impinges. Usually the spatial irradiance distribution can be described by a function $I_s(x, y)$, with x, y being spatial coordinates of a point in the surface. If applied to a field plane, the spatial irradiance distribution necessarily integrates the irradiances produced by a plurality of light bundles.

The term "angular irradiance distribution" is used herein to denote how the irradiance of a light bundle varies depending on the angles of the light rays that constitute the light bundle. Usually the angular irradiance distribution can be described by a function $I_a(\alpha, \beta)$, with $\alpha$, $\beta$ being angular coordinates describing the directions of the light rays. If the angular irradiance distribution has a field dependency, $I_a$ will be also a function of field coordinates, i.e. $I_a=I_a(\alpha, \beta, x, y)$.

The term "scan cycle" is used herein to define the process of imaging an entire mask on a light sensitive surface in one go.

BRIEF DESCRIPTION OF THE DRAWINGS

Various features and advantages of the present invention may be more readily understood with reference to the following detailed description taken in conjunction with the accompanying drawings in which:

FIGS. 3a to 3c are schematic top views on a light sensitive surface at different instances during projection of the first mask shown in FIG. 2, illustrating a first double exposure mode in accordance with the present invention;

FIGS. 5a to 5c are schematic top views on a light sensitive surface at different instances during projection of the second shown in FIG. 4, illustrating a second double exposure mode in accordance with the present invention;

FIG. 9 is a perspective view of a mirror array contained in the illumination system shown in FIG. 8;

FIG. 10 is a perspective view of an optical integrator contained in the illumination system shown in FIG. 8;

FIG. 11 is a top view on an array of optical raster elements that may be used instead of the optical integrator shown in FIG. 10;

FIG. 12 is a sectional view along line XII-XII of the array shown in FIG. 11;

FIG. 26 is a top view on a quickly rotating diffractive optical element comprising a plurality of portions each producing a different irradiance distribution in the pupil plane;

FIG. 27 illustrates the irradiance distribution if one of the portions of the diffractive optical element shown in FIG. 26 is illuminated by a projection light pulse;

FIG. 28 is a top view on a quickly rotating diffractive optical element comprising a plurality of portions each producing a different irradiance distribution in the pupil plane;

FIG. 29 illustrates the irradiance distribution if three portions of the diffractive optical element shown in FIG. 28 are subsequently illuminated by projection light pulses;

FIGS. 37a to 37c illustrate the convolution of an irradiance distribution produced by the stationary diffractive optical element and an irradiance distribution produced by the quickly rotating diffractive optical element if a light pulse is emitted by one of the two light sources;

FIGS. 38a to 38c illustrate the convolution of the irradiance distribution produced by the stationary diffractive optical element and an irradiance distribution produced by the quickly rotating diffractive optical element if a light pulse is emitted by the other one of the two light sources;

DESCRIPTION OF PREFERRED EMBODIMENTS

I

General Construction of Projection Exposure Apparatus

Figure 1:
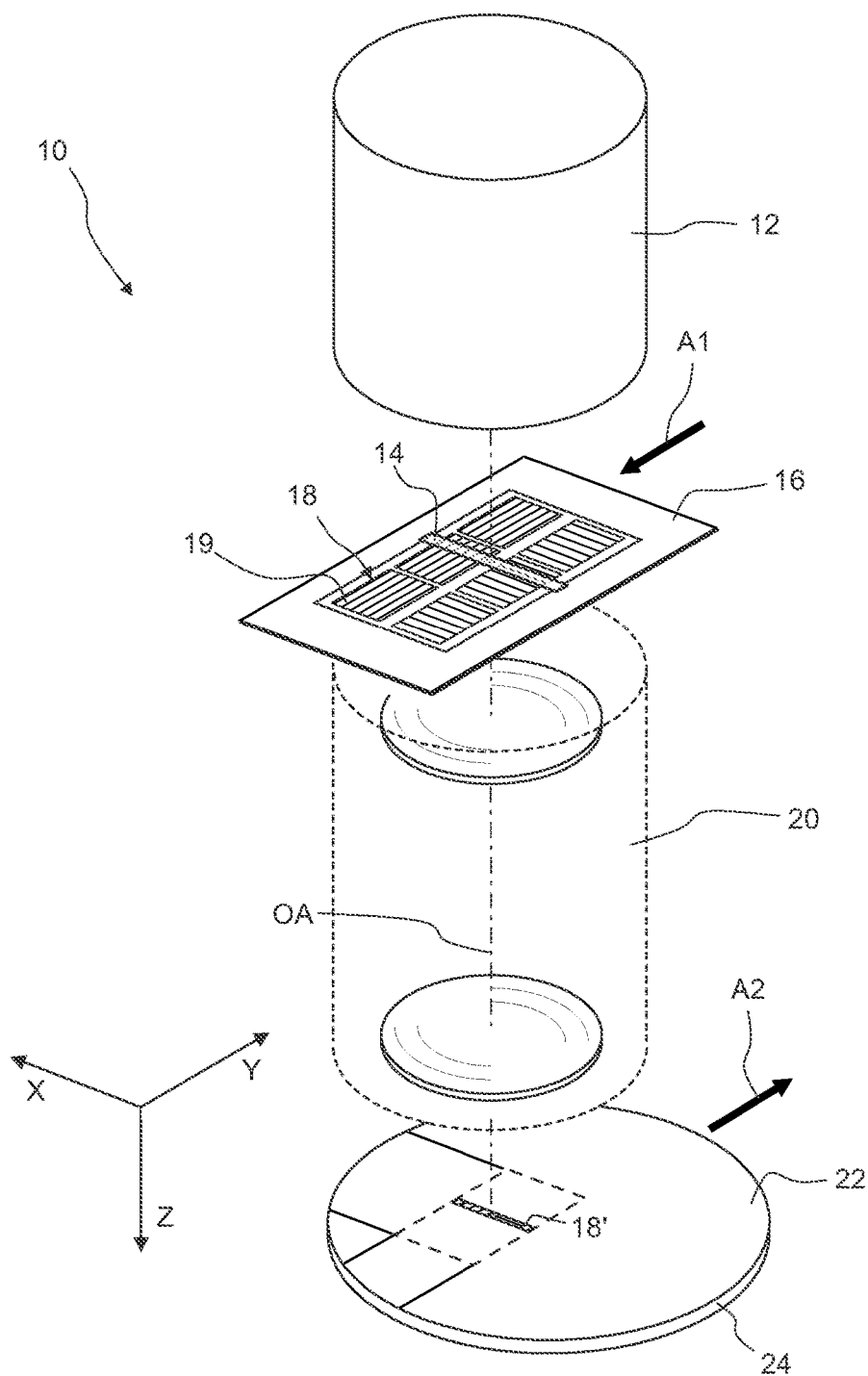
FIG. 1 is a schematic perspective view of a projection exposure apparatus in accordance with one embodiment of the present invention.

FIG. 1 is a perspective and highly simplified view of a projection exposure apparatus 10 in accordance with the present invention. The apparatus 10 comprises an illumination system 12 which produces a projection light beam. The latter illuminates a field 14 on a mask 16 containing a pattern 18 formed by a plurality of small features 19 that are schematically indicated in FIG. 1 as thin lines. In this embodiment the illuminated field 14 has the shape of a slit-like rectangle that is centered with respect to an optical axis OA of the apparatus 10. However, other shapes of the illuminated field 14, for ring segments, and arrangements of the illuminated field 14 outside the optical axis OA, are contemplated as well.

A projection objective 20 images the pattern 18 within the illuminated field 14 onto a light sensitive layer 22, for example a photoresist, which is supported by a substrate 24. The substrate 24, which may be formed by a silicon wafer, is arranged on a wafer stage (not shown) such that a top surface of the light sensitive layer 22 is precisely located in an image plane of the projection objective 20. The mask 16 is positioned via a mask stage (not shown) in an object plane of the projection objective 20. Since the latter has a magnification $\beta$ with $|\beta|<1$, a minified image 18' of the pattern 18 within the illuminated field 14 is projected onto the light sensitive layer 22.

During the projection the mask 16 and the substrate 24 move along a scan direction which corresponds to the Y direction indicated in FIG. 1. The illuminated field 14 then scans over the mask 16 so that patterned areas larger than the illuminated field 14 can be continuously imaged. The ratio between the velocities of the substrate 24 and the mask 16 is equal to the magnification $\beta$ of the projection objective 20. If the projection objective 20 inverts the image ($\beta<0$), the mask 16 and the substrate 24 move in opposite directions, as this is indicated in FIG. 1 by arrows A1 and A2. However, the present invention may also be used in stepper tools in which the mask 16 and the substrate 24 do not move during projection of the mask.

II

Double Exposure

First Embodiment

Figure 2:
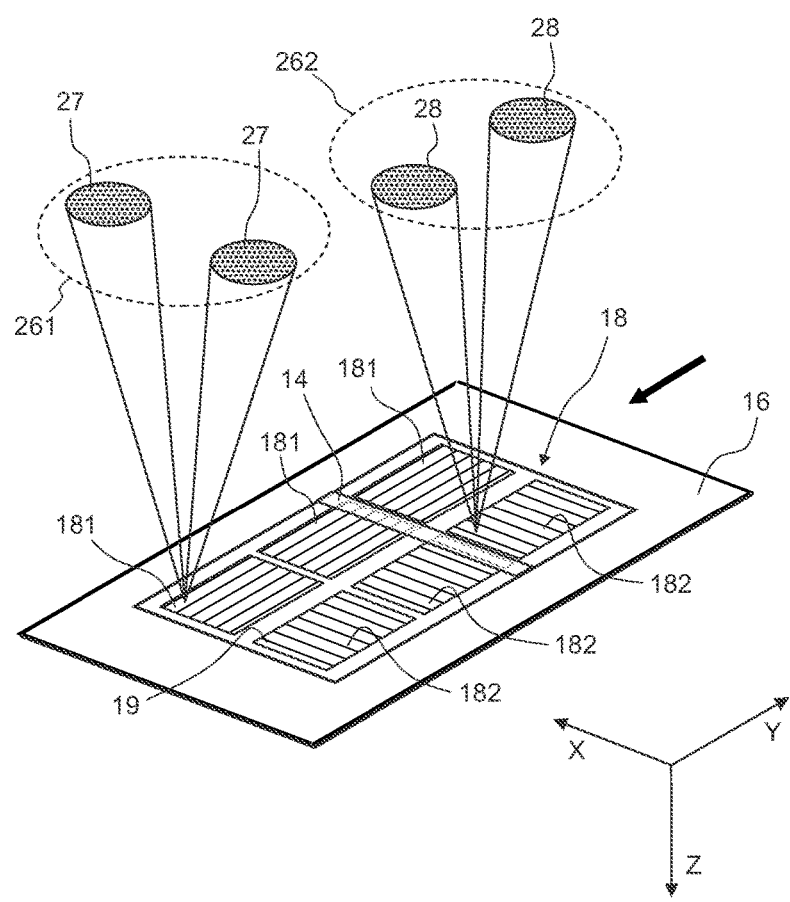
FIG. 2 is an enlarged perspective view of a first mask to be projected by the projection exposure apparatus shown in FIG. 1.

FIG. 2 is an enlarged perspective view of the mask 16. The pattern 18 on the mask 16 mask comprises in this embodiment three first identical mask pattern areas 181 which are arranged one behind the other along the Y direction. For the sake of simplicity it is assumed that the features 19 in the first mask pattern areas 181 are straight lines extending along the Y direction.

The pattern 18 further comprises three identical second mask pattern areas 182 which are also arranged one behind the other along the Y direction, but with a lateral distance from the first mask pattern areas 181 so that the first mask pattern areas 181 and the second mask pattern areas 182 have no common X coordinate. It is assumed that the second mask pattern areas 182 contain only features 19 extending along the X direction.

Within one complete scanning cycle of the mask 16, three first exposed pattern areas associated with the first mask pattern areas 181 and three second exposed pattern areas associated with the second mask pattern areas 182 can be produced. Then the scanning direction is either reversed, or the mask 16 is returned to its original position without any illumination, and a further scanning cycle is performed.

It is further assumed that the dies to be produced by the apparatus 10 have a size that corresponds to one of the exposed pattern areas. In this way two columns of dies can be exposed simultaneously on the substrate 24.

Generally different patterns require different angular irradiance distributions at mask level if maximum image quality is desired. In this embodiment it is assumed that the features 19 extending along the Y direction are best imaged on the light sensitive layer 22 with an X dipole illumination setting. In FIG. 2 the pupil 261 associated with a light bundle that converges towards a field point located in one of the first mask pattern areas 181 is indicated by a broken circle. In the pupil 261 two poles 27, which are spaced apart along the X direction, represent directions from which light propagates towards the field point. Since the patterns are assumed to be uniform over the first mask pattern areas 181, it is thus necessary that this X dipole illumination setting is produced at each field point in the first mask pattern areas 181.

The second mask pattern areas 182 contain only features extending along the X direction. For these features 19 it is assumed that a Y dipole illumination setting results in the best image quality. In FIG. 2 the pupil 262 associated with a light bundle that converges towards a field point located in one of the second pattern areas 182 is also indicated by a broken circle. In the pupil 262 two poles 28, which are spaced apart along the Y direction, represent directions from which light propagates towards the field point. Since the patterns are assumed to be uniform over the second pattern areas 182, it is thus necessary that this Y dipole illumination setting is produced at each field point in the first pattern areas 182.

This implies that the illumination system 12 must be capable of producing two different illumination settings simultaneously and side by side within the illuminated field 14. In section V the structure of illumination systems 12 which is capable of performing this task will be described in more detail with reference to FIGS. 8 to 20.

The mask 16 shown in FIG. 2 is assumed to be used in a double exposure process in accordance with a first embodiment of the invention which will be explained in the following with reference to FIGS. 3a to 3c.

In a double exposure process each die is exposed twice before subsequent manufacturing steps such as etching are performed. Usually this requires the use of two different masks. In a first scanning process a pattern contained in a first mask is transferred to the light sensitive surface 22. Then the first mask is replaced by a second mask. In a second scanning process a pattern contained in the second mask is transferred to the light sensitive surface 22.

Double exposure is advantageous because the patterns contained in the first and second mask can be individually illuminated with optimized illumination settings. This helps to improve the contrast on the light sensitive surface, because all projection light contributes to the image formation. However, when using two different masks in a double exposure process, it is difficult to reduce overlay errors to a tolerable extent. Since the masks are manufactured and tested in different processes, it is challenging to ensure that patterns contained in the two masks perfectly correspond to each other.

FIGS. 3a to 3c illustrate process steps in which a double exposure is performed using only the mask 16. In FIG. 3a, which is a schematic top view on the light sensitive surface 22 during a scan operation, reference numerals 301 denotes first exposed pattern areas that are arranged one behind the other along the scan direction Y. Each first exposure pattern area 301 is an image of one of the first mask pattern areas 181. Reference numerals 302 denote second exposed pattern areas that are also arranged one behind the other along the scan direction Y and to the side of the first exposed pattern areas 301. Each second exposure pattern area 302 is an image of one of the second mask pattern areas 182.

While the illuminated field 14 simultaneously scans over the first mask pattern areas 181 and the second mask pattern areas 182, new pairs of first and second exposure pattern areas 301, 302 are produced on the light sensitive layer 22. During the scan operation the substrate 24 supporting the light sensitive layer 22 moves along the Y direction, as it is indicated by an arrow in FIG. 3a.

After the three first and second mask pattern areas 181, 182 have been transferred to the light sensitive surface 22, the direction of the movement of the mask 16 may be reversed, or the mask 16 is quickly returned to its starting position so that a new series of three pairs of first and second exposure pattern areas can be produced on the light sensitive surface 22.

When the first scanning movement of the substrate 24 is completed, a first row R1 of first exposure pattern areas 301 and a second row R2 of second exposure pattern areas 302 will be produced on the light sensitive surface 22, as this is shown in FIG. 3b.

Then the substrate 24 supporting the light sensitive surface 22 is laterally displaced along the X direction by one row, and the scanning operation is repeated using the same mask 16. However, due to the lateral displacement by one row, images of the first mask pattern areas 181 are superimposed on the second exposure pattern areas 302 forming the second row R2. Thus the dies within the second row R2 are exposed twice, namely the first time with images of the second mask pattern areas 182 and the second time with images of the first mask pattern areas 181. The superimposed images are indicated in FIG. 3b by 301+302. Each image contributing to a superimposed image is produced with the optimum illumination setting as illustrated in FIG. 2, i.e. with an X dipole for the first mask pattern areas 181 and a Y dipole illumination setting for the second mask pattern areas 182.

Images of the second mask pattern areas 182 are not superimposed, but form a next row R3 of second exposed pattern areas 302.

This process of displacing the substrate 24 by one row each time a new row of second exposed pattern areas 302 has been completed is repeated until the entire available light sensitive surface has been exposed. FIG. 3c illustrates the completion of the last row R7 of second exposed pattern areas 302.

The first row R1 and the last row R7 are not exposed twice. Therefore these rows R1, R7 may be placed outside the portion of the light sensitive surface which is used for the production of dies.

III

Double Exposure

Second Embodiment

Figure 4:
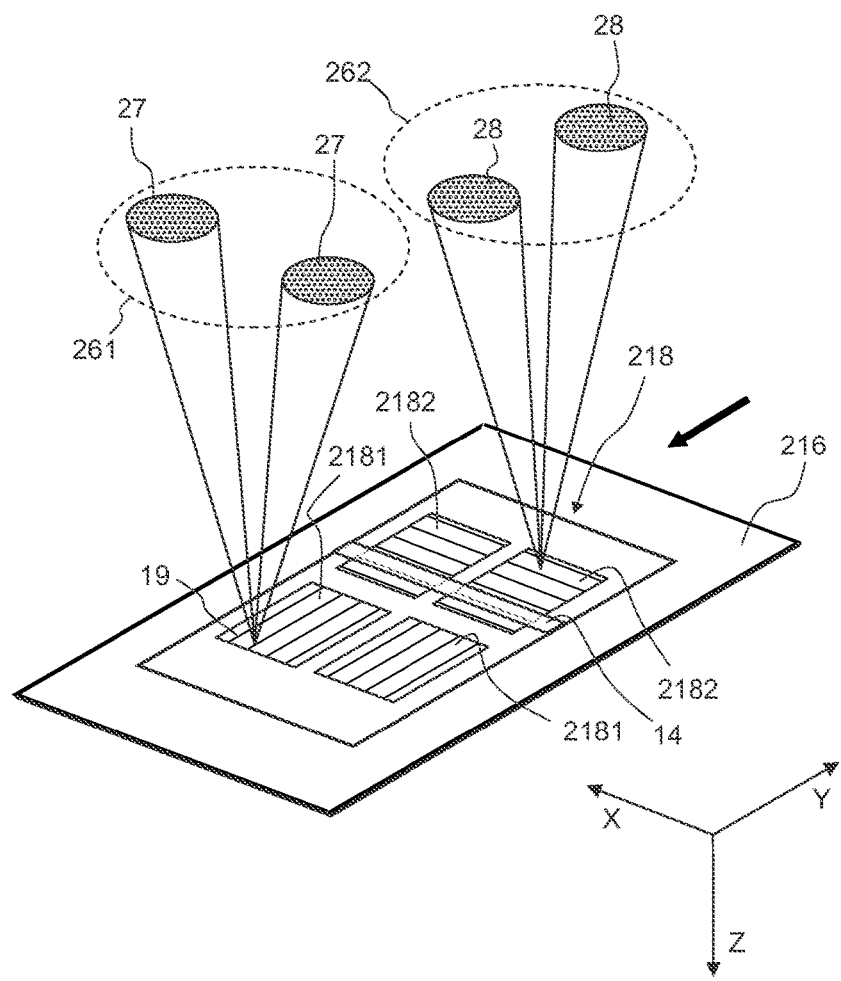
FIG. 4 is an enlarged perspective view of a second mask to be projected by the projection exposure apparatus shown in FIG. 1.

FIG. 4 is an enlarged perspective view of a mask 216 according to a second embodiment. The pattern 218 on the mask 216 comprises two first identical mask pattern areas 2181 which are arranged side by side along the X direction, i.e. the cross scan direction. For the sake of simplicity it is assumed that the features 19 in the first mask pattern areas 2181 are straight lines extending along the Y direction.

The pattern 218 further comprises two identical second mask pattern areas 2182 which are also arranged side by side along the X direction, but displaced from the first mask pattern areas 2181 along the scan direction Y so that the first mask pattern areas 2181 and the second mask pattern areas 2182 have no common Y coordinate. It is assumed that the second mask pattern areas 2182 contain only features 19 extending along the X direction.

Within one complete scanning cycle of the mask 216 two first exposed pattern areas associated with the first mask pattern areas 2181 and two second exposed pattern areas associated with the second mask pattern areas 2182 can be exposed. Then the scanning direction is either reversed, or the mask 216 is returned to its original position without any illumination, and a further scanning cycle is performed.

Also in this embodiment it is assumed that the features 19 extending along the Y direction are best imaged on the light sensitive layer 22 with an X dipole illumination setting, as it is indicated in FIG. 4 by two poles 27 in a pupil 261. The features 19 in the second mask pattern areas 2182 extend along the X direction and are therefore best imaged with a Y dipole setting, as it is indicated in FIG. 4 by two poles 28 in a pupil 262.

Since the patterns are assumed to be uniform over the first and second pattern areas 2181, 2182, it is necessary that the X and Y dipole illumination settings are produced at each field point in the first and second pattern areas 2181, 2182, respectively.

This implies that the illumination system 12 must be capable of changing between two different illumination settings extremely quickly. Assuming typical values of the scan velocity and the distance between the dies along the scan direction Y, the time required to change the illumination setting should be smaller than 5 ms, and preferably be smaller than 1 ms. In section VI the structure of illumination systems 12 which are capable of performing this task will be described in more detail with reference to FIGS. 21 to 38.

The mask 216 shown in FIG. 4 is assumed to be used in a double exposure process according to a second embodiment which will be explained in the following with reference to FIGS. 5a to 5c.

FIGS. 5a to 5c illustrates a sequence of process steps in which a double exposure is performed using only the mask 216. In FIG. 5a, which is a schematic top view on the light sensitive surface 22 during a scan operation, reference numerals 2301 denotes first exposed pattern areas that are arranged side by side along the cross scan direction X. Each pair of first exposure pattern area 2301 is an image of a pair of the first mask pattern areas 2181.

Reference numerals 2302 denote second exposed pattern areas that are also arranged side by side along the cross scan direction X. Each second exposure pattern area 2302 is an image of one of the second mask pattern areas 2182.

While the illuminated field 14 simultaneously scans first over the first pattern areas 2181 and then over the second mask pattern areas 2182, new pairs of first and second exposure pattern areas 2301, 2302 are produced on the light sensitive layer 22. During the scan operation the substrate 24 supporting the light sensitive layer 22 moves along the Y direction, as it is indicated by an arrow in FIG. 5a. After the pattern 219 on the mask 16 has been completely transferred to the light sensitive surface 22, the direction of the movement of the mask 16 is reversed in this embodiment. For that reason two first and two second exposure pattern areas 2301, 2302 are arranged one behind the other along the scan direction Y, if one disregards the first and the last exposure pattern area in each row. Alternatively, the mask 216 may be quickly returned to its starting position so that a new series of two pairs of first and second exposure pattern areas 2301, 2302 can be produced on the light sensitive surface 22.

When the first scanning movement of the substrate 24 is completed, two identical rows R1, R2 of exposure pattern areas 2301, 2302 will be produced on the light sensitive surface 22. In each row R1, R2 two first and two second exposure pattern areas 2301, 2302 alternate along the scan direction Y except the first and last areas in each row.

Then the mask 216 is longitudinally displaced by one length, and the scanning operation is repeated using the same mask 216. However, due to the displacement of the mask 216, images of the first mask pattern areas 2181 are superimposed on the second exposure pattern areas 2302, and images of the second mask pattern areas 2182 are superimposed on the first exposure pattern areas 2301. In FIG. 5b areas with superimposed images are indicated by 2301+2302. Thus the dies within the rows R1, R2 are exposed twice, namely first with an image of the first mask pattern area 2181 and then with an image of the second mask pattern area 2182, or vice versa. Each image is formed with the optimum illumination setting as illustrated in FIG. 4, i.e. with an X dipole for the first mask pattern areas 2181 and a Y dipole illumination setting for the second mask pattern areas 2182.

After two rows R1, R2 have been completely exposed twice, the substrate 26 is displaced laterally along the cross scan direction X by two rows, and the same process is repeated. These steps are performed until the entire available light sensitive surface 22 has been exposed. FIG. 5c illustrates the completion of the last two rows R5, R6.

IV

Double Exposure

Third Embodiment

Figure 6:
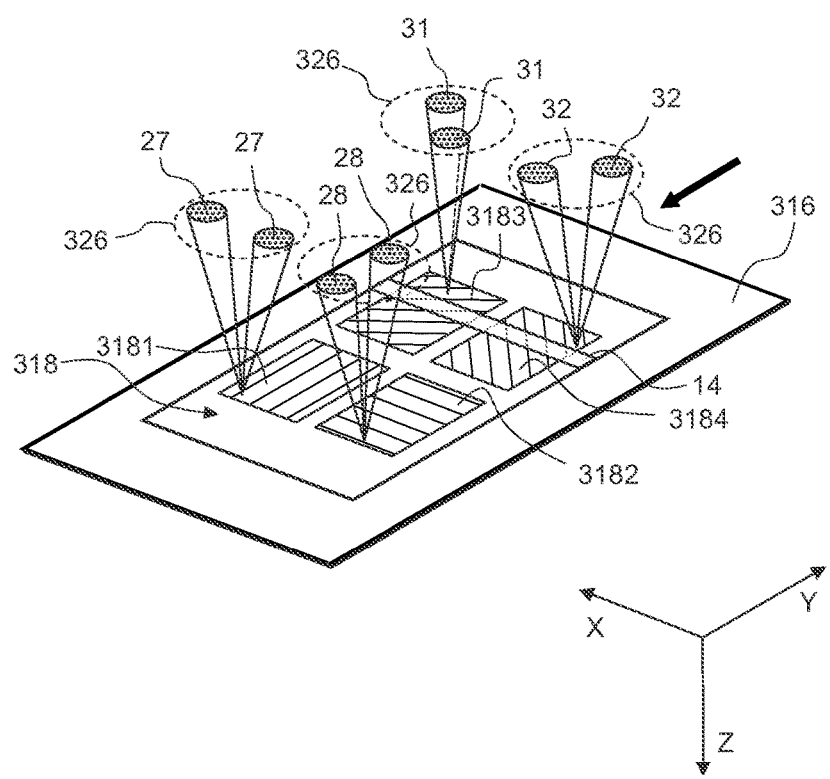
FIG. 6 is an enlarged perspective view of a third mask to be projected by the projection exposure apparatus shown in FIG. 1.

FIG. 6 is an enlarged perspective view of a mask 316 according to a third embodiment. The pattern 318 on the mask 316 comprises a first mask pattern area 3181 containing only features 19 extending along the Y direction, and a second mask pattern area 3182 containing only features 19 extending along the X direction. A third mask pattern area 3183 contains only features 19 extending parallel to a −XY diagonal, and a fourth mask pattern area 3184 contains only features 19 extending parallel to an XY diagonal. Pupils 326 containing poles 27, 28, 31 and 32, respectively, represent illumination settings which ensure an optimum imaging of the features 19 in the respective mask pattern areas 3181 to 3184.

The four mask pattern areas 3181 to 3184 are arranged in pairs along the X and the Y direction so that each mask pattern area has a direct neighbor in the X direction and a direct neighbor in the Y direction.

The mask 316 as shown in FIG. 6 is assumed to be used in a fourfold exposure process which is in fact a combination of the first embodiment shown in FIGS. 2 and 3 and the second embodiment shown in FIGS. 4 and 5.

Figure 7A:
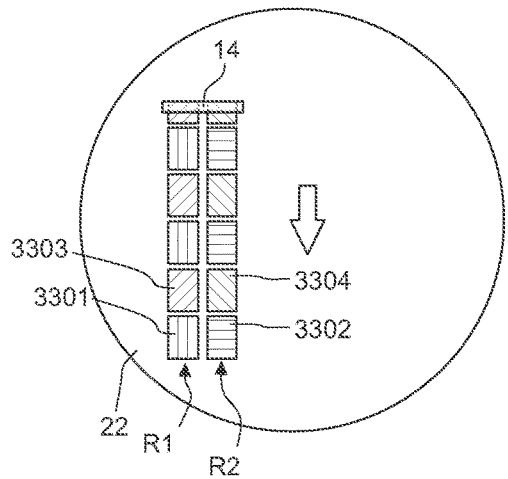
FIGS. 7a to 7c are schematic top views on a light sensitive surface at different instances during projection of the mask shown in FIG. 6, illustrating a third double exposure mode which combines the two exposure modes illustrated in FIGS. 2 to 5.

This will be explained in the following with reference to FIGS. 7a to 7d which illustrate a sequence of process steps in which a fourfold exposure is performed using only the mask 316. In FIG. 7a, which is a schematic top view on the light sensitive surface 22 during a scan operation, reference numeral 3301 denotes first exposed pattern areas which are images of the first mask pattern area 3181, reference numeral 3302 denotes second pattern areas which are images of the second mask pattern area 3182, reference numeral 3303 denotes third exposed pattern areas which are images of the third mask pattern area 3183, and reference numeral 3304 denotes fourth exposed pattern areas 3304 which are images of the fourth mask pattern area 3184. In FIG. 7a it can be seen that by repeating several scan cycles groups of the four exposed pattern areas 3301 to 3304 are repeatedly produced on the light sensitive surface 22, corresponding to two rows R1, R2 of dies. In row R1 first exposed pattern areas 3301 and third exposed pattern areas 3303 alternate, and in row R2 second exposed areas 3302 and fourth exposed areas 3034 alternate along the scan direction Y. As a matter of course, also in this embodiment each of the four mask pattern area 3181 to 3184 is illuminated with the optimum illumination setting as illustrated in FIG. 6. This also applies to the subsequent exposures described in the following.

Figure 7B:
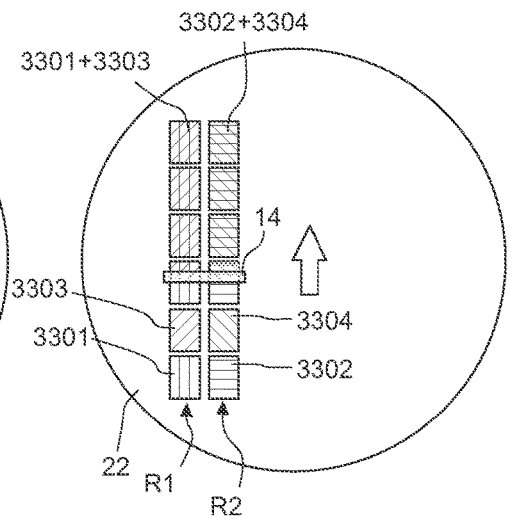

FIG. 7b illustrates the next process step in which the second exposure is performed with the same mask 316 in a manner which is similar to the second embodiment as illustrated in FIGS. 5a to 5b. While the substrate 24 supporting the light sensitive surface 22 moves now along the opposite direction, an image of the third mask pattern area 3183 is superimposed on the first exposed pattern areas 3301, and simultaneously an image of the fourth mask pattern area 3184 is superimposed on the second exposed pattern area 3302. Similarly, images of the first mask pattern areas 3181 are superimposed on the third exposed pattern areas 3303, and simultaneously images of the second mask pattern areas 3182 are superimposed on the fourth exposed pattern areas 3304. When this scan operation is terminated, a first row R1 is obtained containing superpositions 3301+3303 of images of the first mask pattern area 3181 and of the third mask pattern area 3183, and a second row R2 is obtained containing superpositions 3302+3304 of images of the second mask pattern area 3182 and the fourth mask pattern area 3184.

Figure 7C:
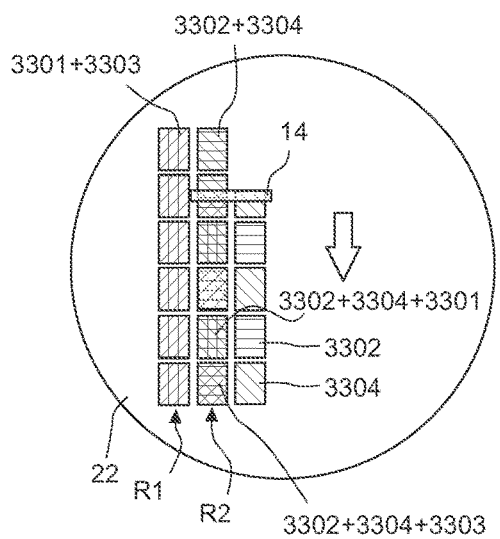
Figure 7D:
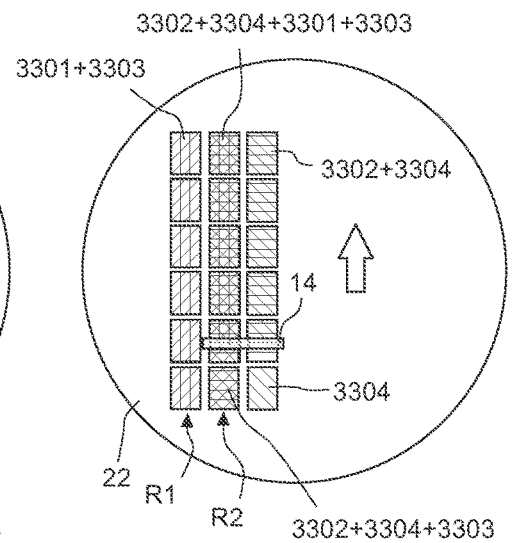

Until now this process may be considered as a double exposure process in accordance with the second embodiment which has been described with reference to FIGS. 4 and 5. This is now combined with the process which has been described above with reference to FIGS. 2 and 3. Thus, before the next scan cycle, the substrate 24 supporting the light sensitive surface 22 is displaced along the cross scan direction X by one row, as it is illustrated in FIG. 7c. During the subsequent scan cycles images of the first and third mask pattern areas 3181, 3183 are alternately superimposed on the combined exposed pattern areas 3302+3304. This results in a row R2 which is a sequence of exposed pattern areas 3302+3304+3301 and 3302+3304+3303. Additionally, a third row R3 is produced in which second exposed pattern areas 3302 and fourth exposed pattern areas 3304 alternate.

Then the direction of movement of the substrate 24 supporting the light sensitive surface 22 is reversed again, and images of the first mask pattern area 3181 are superimposed on the combined exposed areas 3302+3304+3303, and alternately images of the third mask pattern area 3183 are superimposed on the combined exposed pattern areas 3303+3304+3301. In both cases this results in a complete superposition 3303+3304+3301+3302 of all four images of the mask pattern areas 3181 to 3184, as it can be seen in row R2 of FIG. 7d.

V

Illumination System for First Embodiment

In the following an illumination system will be described which is capable of simultaneously producing two different angular light distributions side by side on the mask 16. Such an illumination system is required for carrying out the first embodiment of the double exposure scheme that has been described above with reference to FIGS. 2 and 3.

1. General Construction

Figure 8:
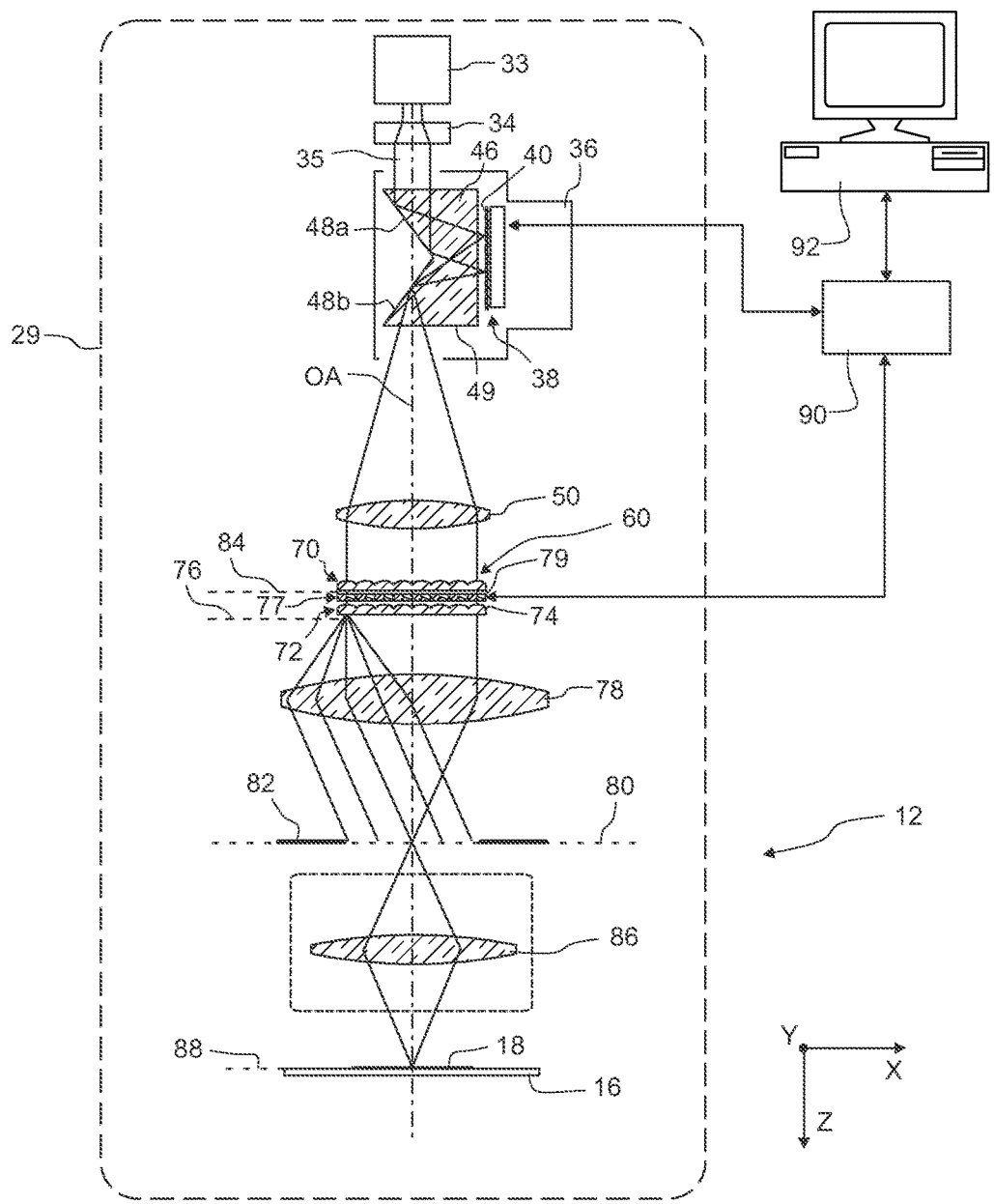
FIG. 8 is a meridional section through an illumination system which is part of the apparatus shown in FIG. 1 and which is suitable to perform the exposure method illustrated in FIGS. 2 and 3.

FIG. 8 is a meridional section through the illumination system 12 shown in FIG. 1. For the sake of clarity, the illustration of FIG. 8 is considerably simplified and not to scale. This particularly implies that different optical units are represented by one or very few optical elements only. In reality, these units may comprise significantly more lenses and other optical elements.

The illumination system 12 includes a housing 29 and a light source 33 that is, in the embodiment shown, realized as an excimer laser. The light source 33 emits projection light having a wavelength of about 193 nm. Other types of light sources 33 and other wavelengths, for example 248 nm or 157 nm, are also contemplated.

In the embodiment shown, the projection light emitted by the light source 33 enters a beam expansion unit 34 which outputs an expanded and almost collimated light beam 35. To this end the beam expansion unit 34 may comprise several lenses or may be realized as a mirror arrangement, for example.

The projection light beam 35 then enters a pupil defining unit 36 that is used to produce variable spatial irradiance distributions in a subsequent pupil plane. To this end the pupil defining unit 36 comprises a mirror array 38 comprising a large number of very small mirrors 40 that can be tilted individually about two orthogonal axes with the help of actuators. FIG. 9 is a perspective view of the mirror array 38 illustrating how two parallel light beams 42, 44 are reflected into different directions depending on the tilting angles of the mirrors 40 on which the light beams 42, 44 impinge. In FIGS. 8 and 9 the mirror array 38 comprises only 66mirrors 40; in reality the mirror array 38 may comprise several hundreds or even several thousands mirrors 40.

The pupil defining unit 36 further comprises a prism 46 having a first plane surface 48a and a second plane surface 48b that are both inclined with respect to an optical axis OA of the illumination system 12. At these inclined surfaces 48a, 48b impinging light is reflected by total internal reflection. The first surface 48a reflects the impinging light towards the mirrors 40 of the mirror array 38, and the second surface 48b directs the light reflected from the mirrors 40 towards an plane exit surface 49 of the prism 46. The angular irradiance distribution of the light emerging from the exit surface 49 can thus be varied individually by tilting the mirrors 40 of the mirror array 38. More details with regard to the pupil defining unit 38 can be gleaned from US 2009/0116093 A1.

The angular irradiance distribution produced by the pupil defining unit 36 is transformed into a spatial irradiance distribution with the help of a first condenser 50. The condenser 50, which may be dispensed with in other embodiments, directs the impinging light towards an optical integrator 60. The optical integrator 60 comprises, in this embodiment, a first array 70 and a second array 72 of optical raster elements 74. FIG. 10 is a perspective view of the two arrays 70, 72. Each array 70, 72 comprises, on each side of a support plate, a set of cylinder lenses 71, 73 that extend along the X and the Y direction, respectively. The order of the cylinder lenses 71 and 73 may be reversed on at least one of the arrays 70, 72. Each volume defined by the intersection of two orthogonal cylinder lenses 71, 73 forms an optical raster element 74. Thus each optical raster element 74 may be regarded as a microlens having cylindrically curved surfaces. The use of cylinder lenses is advantageous particularly in those cases in which the refractive power of the optical raster elements 74 shall be different along the X and the Y direction.

FIGS. 11 and 12 show a first array 70' of optical raster elements 74' according to an alternative embodiment in a top view and a sectional view along line XII-XII, respectively. Here the optical raster elements 74' are formed by plano-convex lenses having a rectangular contour. The second array differs from the first array 70' only with regard to the curvature of the convex surface of the optical raster elements 74'.

Referring again to FIG. 8, the optical raster elements 74 of the first and second array 70, 72 respectively, are arranged one behind the other in such a way that one optical raster element 74 of the first array 70 is associated in a one to one correspondence with one optical raster element 74 of the second array 72. The two optical raster elements 74 being associated with each other are aligned along a common axis and define an optical channel. Within the optical integrator 60 a light beam propagating in one optical channel does not cross or superimpose with light beams propagating in other optical channels. In other words, the optical channels that are associated with the optical raster elements 74 are optically isolated from each other.

A front focal plane of a condenser 78 forms a pupil plane 76 of the illumination system 12. In this embodiment the pupil plane 76 is located behind the second array 72; however, it may equally be arranged in front of it. The second condenser 78 thus establishes a Fourier relationship between the pupil plane 76 and a field stop plane 80 in which an adjustable field stop 82 is arranged.

The field stop plane 80 is optically conjugated to a raster field plane 84 which is located within or in close proximity to the first array 70 of the optical integrator 60. This means that each raster field plane element, i.e. the area in the raster field plane 84 within an optical channel, is imaged on the entire field stop plane 80 by the associated optical raster element 74 of the second array 72 and the second condenser 78. Images of the irradiance distributions in the raster field plane elements superimpose in the field stop plane 80, and this results in its very homogenous illumination. This process is often described by identifying the illuminated areas in the optical channels with secondary light sources that commonly illuminate the field stop plane 80.

Between the two arrays 70, 72, or at another location in or in close proximity to the raster field plane 84, a polarization modulator 77 is arranged. The polarization modulator 77 is configured to modify a field dependency of the state of polarization of projection light in the illuminated field 14. To this end the polarization modulator 77 comprises a plurality of individual modulator units 79 that are configured to variably modify, in response to a control signal, the state of polarization of the light beams, which are associated with the optical raster elements 74, differently in at least two portions of each raster field plane element. This will be explained below in further detail with reference to FIGS. 14 and 16 to 18.

The field stop plane 80 is imaged by a field stop objective 86 onto a mask plane 88 in which the mask 16 is arranged with the help of a mask stage (not shown). The adjustable field stop 82 is also imaged on the mask plane 88 and defines at least the short lateral sides of the illuminated field 14 extending along the scan direction Y.

The pupil defining unit 36 and the polarization modulator 77 are connected to a control unit 90 which is, in turn, connected to an overall system control 92 illustrated as a personal computer. The control unit 90 is configured to control the mirrors 40 of the pupil defining unit 36 and the modulator units 79 of the polarization modulator 77 in such a manner that a desired field dependency of the angular irradiance distribution and also of the state of polarization in the mask plane 88 is obtained.

In the following it will be described with reference to FIGS. 13 to 18 how this is accomplished.

2. Function and Control of the Illumination System a. Spot Formation

Figure 13:
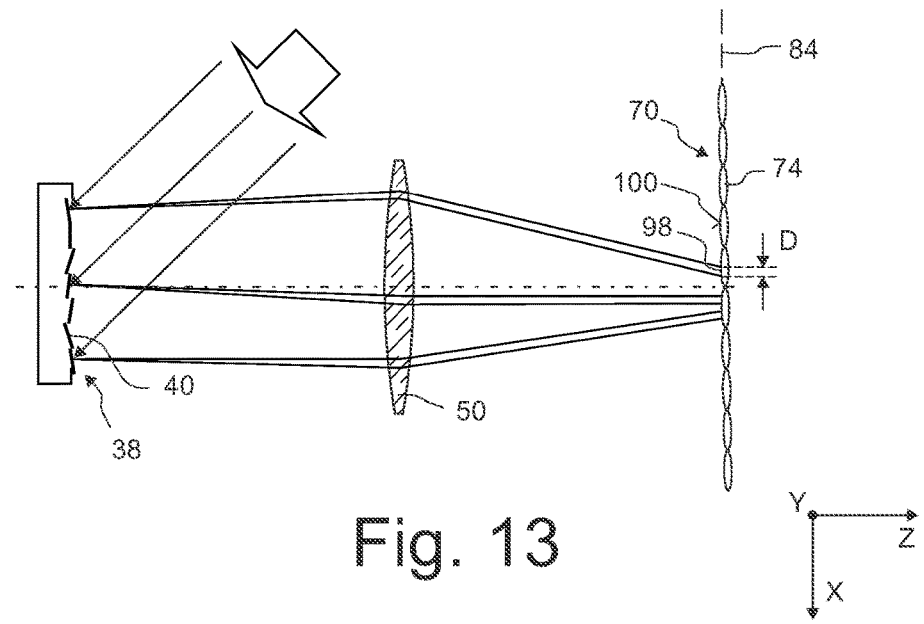
FIG. 13 is a schematic meridional section through a portion of the illumination system shown in FIG. 8 in which only a mirror array, a condenser and an array of optical raster elements are shown.

FIG. 13 is a schematic cut-out from FIG. 8 showing the mirror array 38, the first condenser 50 and some of the optical raster elements 74 of the first array 70 of the optical integrator 60. In this embodiment the optical raster elements 74 are illustrated, for the sake of simplicity, as rotationally symmetrical biconvex lenses having rectangular borderlines.

Each mirror 40 of the mirror array 38 produces a light beam which illuminates a small spot 98 with diameter D on a light entrance facet 100 of one of the optical raster elements 74. The position of the spots 98 may be varied by tilting the mirrors 40. The geometry of the spots 98 depends, among others, on the optical properties of the mirrors 40 of the mirror array 38. If there is an additional microlens array between the beam expansion unit 34 and the pupil defining unit 36 which avoids projection light to be absorbed in gaps between the mirrors 40, also such a microlens array will have an impact on the geometry of the spots 98. In some embodiments the geometry of the spots 98 is circular; in other embodiments the geometry may be approximately rectangular and in particular square.

As can be seen in FIG. 13, the diameter D of the spots 98 is smaller than the diameter of the light entrance facet 100 of the illuminated optical raster element 74. Generally the total area of each spot 98 illuminated on a light entrance facet 100 of an optical raster element 74 should be considerably, for example at least 5 times, preferably at least 10 times, more preferably at least 20 times, smaller than the area of the respective light entrance facet 100. If the light entrance facets 100 have different areas and each spot 98 can be produced on any of these facets, the maximum area of the light entrance facets 100 may be taken as reference.

If the spots 98 are sufficiently small in comparison to the light entrance facets 100 of the optical raster elements 74, it is possible to produce different light patterns on the light entrance facets 100. The light patterns may be easily varied by suitably controlling the mirror elements 40 with the help of the control unit 90.

b. Effect of Light Pattern Variation

Since the light entrance facets 100 are located in or in close proximity to the raster field plane 84, the light patterns on the light entrance facets 100 are imaged, via the optical raster elements 74 of the second array 72 and the second condenser 78, on the intermediate field plane 80.

Figure 14:
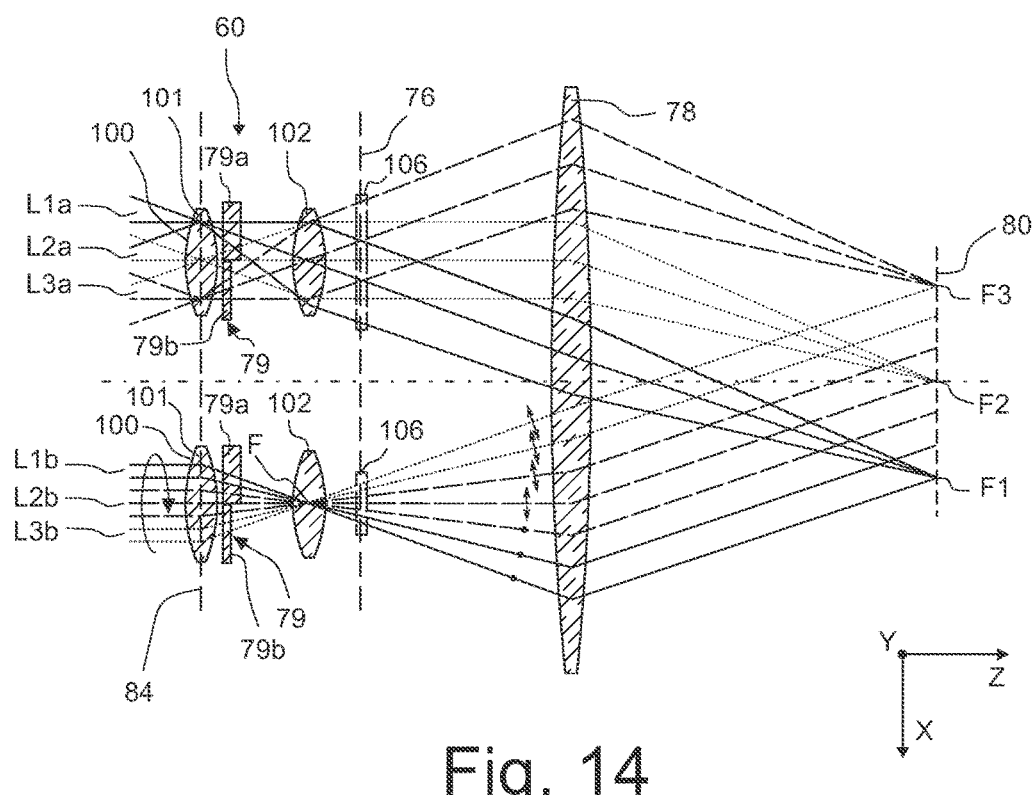
FIG. 14 is an enlarged cut-out of FIG. 8 showing first and second microlenses of the optical raster element and a condenser lens.

This will now be explained with reference to FIG. 14 which is an enlarged and not to scale cut-out of FIG. 8 showing a portion of the optical integrator 60, the second condenser 78 and the intermediate field plane 80. For the sake of simplicity only two pairs of optical raster elements 74 of the optical integrator 60 are shown in FIG. 14. Two optical raster elements 74 that are associated with a single optical channel are referred to in the following as first microlens 101 and second microlens 102. As mentioned above, the microlenses 101, 102, which are sometimes also referred to as field and pupil honeycomb lenses, may be configured as individual microlenses having rotationally symmetrical refractive surfaces and a rectangular borderline, or as crossed cylindrical microlenses as shown in FIG. 10, for example. It is only required that the microlenses 101, 102 have at least along one direction perpendicular to an optical axis OA of the illumination system 12 a non-zero refractive power.

Each pair of microlenses 101, 102 associated with a particular optical channel produces a secondary light source 106 in the pupil plane 76. In the upper half of FIG. 14 it is assumed that converging light bundles L1a, L2a and L3a illustrated with solid, dotted and broken lines, respectively, impinge on different points of the light entrance facet 100 of the first microlens 101. After having passed the two microlenses 101, 102 and the condenser 78, each light bundle L1a, L2a and L3a converges to a focal point F1, F2 and F3, respectively. From the upper half of FIG. 14 it thus becomes clear that the positions where light rays impinge on the light entrance facet 100 and the positions where these light rays pass the intermediate field plane 80 (or any other conjugated field plane) are optically conjugate.

The lower half of FIG. 14 illustrates the case when collimated light bundles L1b, L2b and L3b impinge on different regions of the light entrance facet 100 of the first microlens 101. This is the more realistic case because the light impinging on the optical integrator 60 is usually indeed substantially collimated. The light bundles L1b, L2b and L3b are focused in a common focal point F located in the second microlens 102 and then pass, now collimated again, the intermediate field plane 80. Again it can be seen that, as a result of the optical conjugation, the region where a light bundle L1b, L2b and L3b impinges on the light entrance facet 100 corresponds to the region which is illuminated in the intermediate field plane 80.

The dimension of the field illuminated in the intermediate field plane 80 (and thus the field 14 illuminated in the mask plane 88) can therefore be varied by changing the region that is illuminated on the light entrance facet 100 of the first microlens 101. The size and geometry of this region can be changed very efficiently by reassembling the spots 98 with the help of the mirror array 38 of the pupil defining unit 36, as it has been explained above with reference to FIG. 13.

As a matter of course, these considerations apply separately for the X and the Y direction. Thus the geometry of the illuminated field 14 can be varied independently for the X and Y direction by varying the illumination of the light entrance facets 100 separately for the X and Y direction, respectively. In other words, almost any arbitrary geometry of the field illuminated in the intermediate field plane 80 can be obtained if the region illuminated on the light entrance facets 100 of the first microlenses 101 is suitably determined.

For example, if one first microlens 101 is illuminated with a light bundle L1b as shown in the lower half of FIG. 14 and another first microlens 101 is illuminated with a light bundle L2b, the secondary light sources associated with the two different first microlenses 101 will illuminate different portions in the intermediate field plane 80. The crucial point in this respect, however, is that two different first microlenses 101 can be located at different positions, and consequently the associated secondary light sources illuminate the intermediate field plane 80 from different directions. In other words, different portions in the intermediate field plane 80 will then be illuminated with different angular light distributions.

Figure 15:
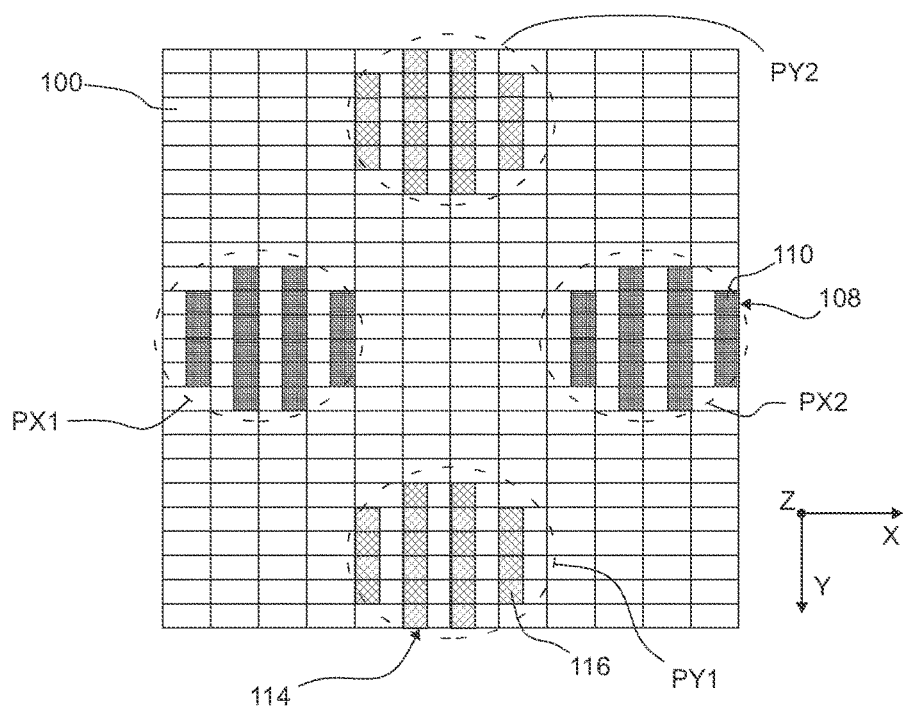
FIG. 15 is a top view on the spatial irradiance distribution on the light entrance facets of the optical integrator.

FIG. 15 is an exemplary top view on the light entrance facets 100 of a plurality of first microlenses 101 of the optical integrator 60. For the sake of illustration the light entrance facets 100 are shown with an enlarged size along the scan direction Y. In reality, the geometry of the light entrance facets approximately corresponds to the geometry of the illuminated field 14.

Some of the light entrance facets 100 are illuminated with the help of the pupil defining unit 36 with first light patterns 108. Each first light pattern 108 comprises a lateral stripe 110 extending along the Y direction and covering one half (if seen along the X direction) of the light entrance facet 100. The light entrance facets 100 illuminated with the first light pattern 108 are arranged over the entrance surface of the optical integrator 60 such that they form two approximately circular or elliptical poles PX1, PX2 that are spaced apart along the X direction.

Other light entrance facets 100 are illuminated with a second light pattern 114 which also comprises only a lateral stripe 116 extending along the Y direction. However, the stripe 116 of the second light pattern 114 is located on the other half of the light entrance facet 100 (if seen along the X direction) in comparison with the stripe 110 of the first light pattern 108. The light entrance facets 100 which are illuminated with the second light patterns 114 are arranged such that they form two approximately circular poles PY1, PY2 that are spaced apart along the Y direction.

Those first microlenses 101 whose light entrance facet 100 is illuminated with the first light pattern 108 commonly illuminate in the intermediate field plane 80, and consequently in the mask plane 88, a portion that has the same geometry as the lateral stripe 110 of the first light pattern 108. Since these light entrance facets 100 are arranged at the entrance side of the optical integrator 60 in the shape of two poles PX1, PX2, the secondary light sources associated with these light entrance facets 100 illuminate these portions (only) obliquely from the X direction, as it is characteristic of an X dipole illumination setting. As a result, the first portions 181 on the mask 16 are illuminated with an X dipole illumination setting, as it is illustrated in FIG. 2.

Those light entrance facets 100 which are illuminated with the second light pattern 114 contribute to the illumination of a stripe in the other half in the illuminated field 14. Since these light entrance facets 100 are arranged on the entrance side of the optical integrator 60 such that they form two poles PY1, PY2, the other half in the illuminated field 14 is illuminated with an Y dipole illumination setting, as it is also shown in FIG. 2.

Thus it is possible to produce simultaneously two different illumination settings at different portions of the illuminated field 14.

By suitably rearranging the spots 98 on the light entrance facets 100 of the optical integrator 60 with the help of the control unit 90, it is thus possible to produce almost any arbitrary field dependency of the angular light distribution in the mask plane 88. The time which is required to change the field dependency of the angular light distribution mainly depends on how fast the mirrors 40 of the mirror array 38 can be tilted accurately by the required tilting angles.

c. Polarization Control

As mentioned before, the illumination system 12 is also capable of illuminating the mask pattern areas 181 on the one hand and the mask pattern areas 182 on the other hand with projection light having different states of polarization. It is known in the art that not only the angular light distribution, but also the state of polarization of projection light at mask level has an impact on the quality, and in particular on the contrast, of the image which is formed on the light sensitive surface 22. Thus it is desirable to be able to illuminate different portions on the mask 16 with projection light having different states of polarization.

This can be achieved in the illumination system 12 with the help of the polarization modulator 77 that has been briefly described further above. The polarization modulator 77 comprises a plurality of modulator units 79 that are arranged in or in close proximity to the raster field plane 84.

This is elucidated first with reference to FIG. 14 in which two modulator units 79 are shown. Each modulator unit 79 is arranged in close proximity to the raster field plane 84. Assuming typical dimensions this implies a distance from the raster field plane 84 of less than 3 mm. Each modulator unit 79 is associated with a single optical channel or, in other words, with a single raster field plane element which is defined as the area of an optical channel in the raster field plane 84.

Each modulator unit 79 is capable of variably modifying the state of polarization differently in at least two portions of each raster field plane element in response to a control signal provided by the control unit 90. Since each raster field plane element is optically conjugate to the entire field 14 which is illuminated on the mask, the modulator units 97 are thus capable of producing different states of polarization in different portions of the illuminated field 14.

For modifying the state of polarization differently in two portions of each raster field plane element, each modulator unit 79 comprises two birefringent components 79a and 79b having a variable thickness. With a suitable arrangement of the optic axis of the birefringent material it is therefore possible to modify the state of polarization differently for the projection light which passes through the first component 79a on the one hand and the second component 79b on the other hand.

For example, the thickness of the birefringent components 79a, 79b may be selected so that circularly polarized light is transformed into s-polarized light by the first birefringent component 79a and into p-polarized light by the second birefringent component 79b. As it can be seen best in the lower portion of FIG. 14, projection light emerging from the first birefringent component 79a as s-polarized light illuminates exclusively one half of the illuminated field, and light emerging from the second birefringent component 79b exclusively illuminates the other half of the illuminated field. In this manner different portions on the illuminated field can be illuminated with projection light having different states of polarization.

Figures 16, 17, 18:
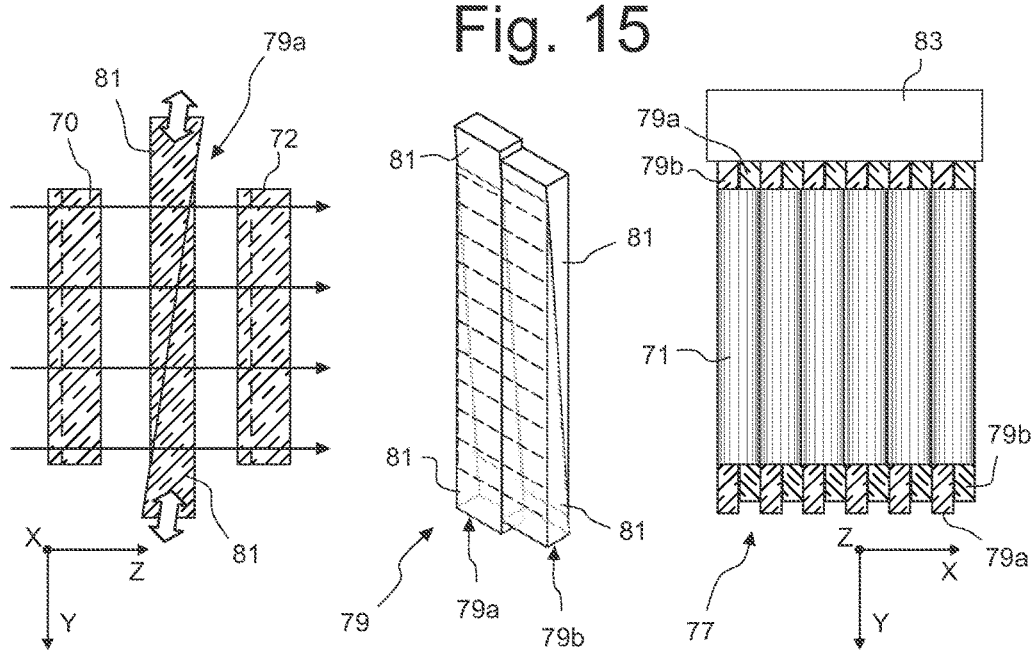
FIG. 16 is a sectional view through a polarization manipulator in an YZ plane.
FIG. 17 is a perspective view of a polarization manipulator unit contained in the polarization manipulator shown in FIG. 16.
FIG. 18 is a top view on the optical integrator and the polarization manipulator.

In order to be able to vary the thickness of the birefringent components 79a, 79b, each of them may include two birefringent wedges that can be displaced in a direction perpendicular to an optical axis of the illumination system with the help of a drive. This is schematically illustrated in FIGS. 16 to 18. FIG. 16 shows two wedges 81a, 81b arranged between the two arrays 70, 72 of the optical integrator 60 in a meridional section, FIG. 17 shows two pairs of wedges forming a modulator unit 79 in a perspective view, and FIG. 18 is a top view on the optical integrator 60 and a plurality of modulator units 91 if seen along the optical axis from the light source side. As a matter of course, the wedges 81a, 81b could also be arranged in front of the array 70.

If the wedges 81 associated with a birefringent component 79a, 79b are displaced along the directions as indicated by double arrows in FIG. 16, the thickness along the direction of the optical axis can be varied with the help of a drive 83.

In FIGS. 17 and 18 it can be seen that each modulator unit 79 comprising four wedges 81 extends over the entire length of the optical integrator 60 along the scan direction Y. Thus the thickness of the birefringent components 97a, 97b varies only along the cross scan direction X, but not along the scan direction Y. This ensures that in all optical channels, which are indicated in FIG. 17 with broken lines, the modulator units 79 have the same impact on the state of polarization.

3. Alternative Embodiments

In the following two alternative embodiments of illuminations systems 12 will be described with reference to FIGS. 19 and 20 that are likewise suitable to produce simultaneously different angular light distributions on different mask pattern areas.

a. Diffractive Optical Element

In the illumination system 12 shown in FIG. 8 the different angular light distributions on the first and second mask pattern areas 181, 182 are a result of different irradiance distributions, which are produced with the help of the pupil defining unit 36 on the light entrance facets 100 of the optical integrator 60. These irradiance distributions are modified by rearranging the light spots 98 produced by the mirrors 40 of the mirror array 38.

Figure 19:
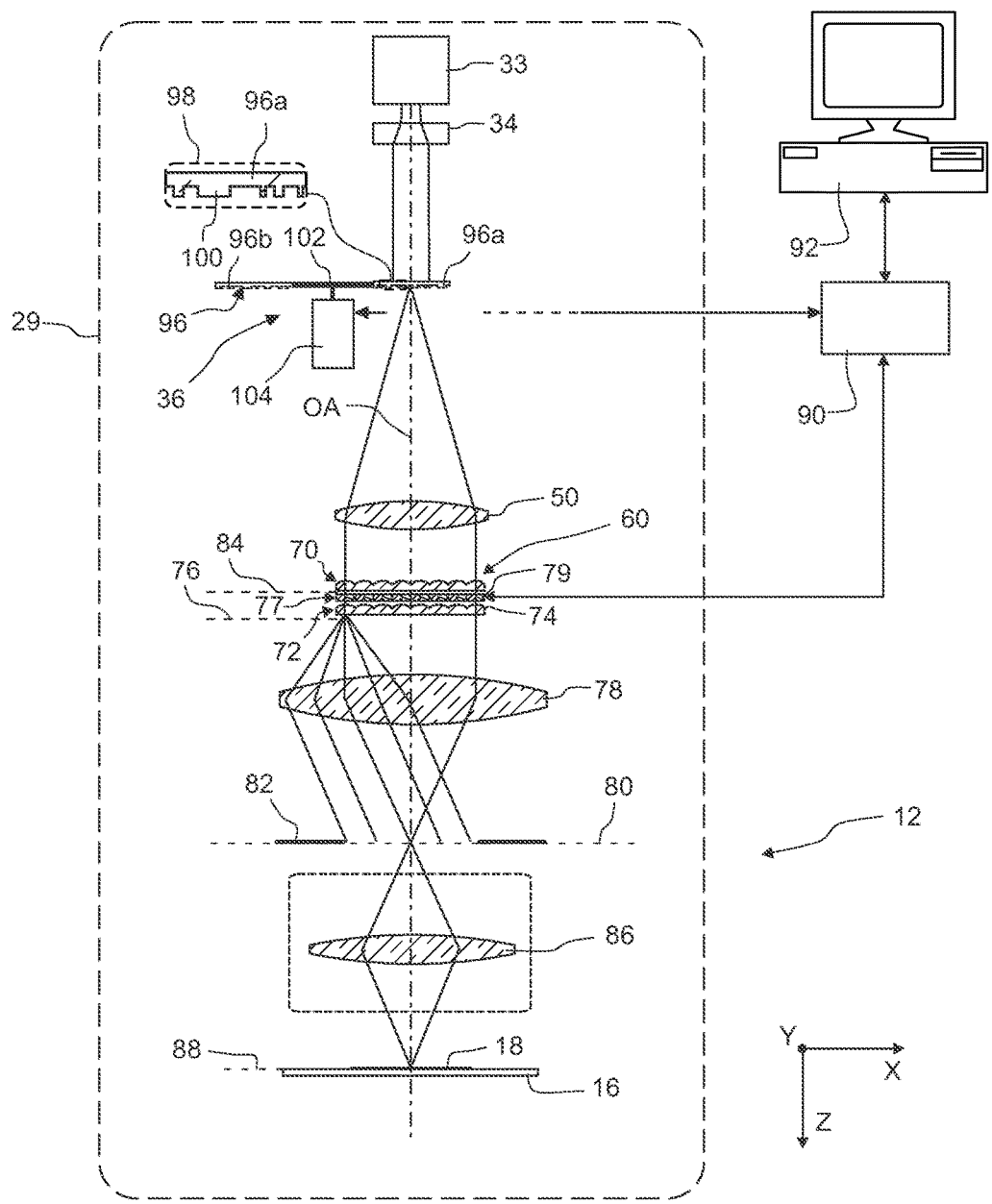
FIG. 19 is a meridional section through an illumination system according to an alternative embodiment which is also suitable to perform the exposure method illustrated in FIGS. 2 and 3.

FIG. 19 shows an embodiment in which the pupil defining unit 36 does not contain a mirror array 38, but a diffractive optical element 96. As can be seen in the enlarged cut-out 98, the diffractive optical element 96 comprises a plurality of minute diffractive structures 100. The diffractive optical element 96 may be realized as a computer generated hologram (CGH), for example, as it is known in the art as such.

In the embodiment shown the diffractive optical element 96 comprises a plurality of portions 96a, 96b having different diffractive properties. The diffractive optical element 96 is received in a turret holder 102 which is configured to rotate the diffractive optical element 96 around a rotational axis with the help of a drive 104. Thus one of the portions 96a, 96b can be inserted at a given time into the light path of the projection light. As a matter of course, other types of exchange holders may be used as well to this end.

Depending on the portion 96a or 96b that is inserted into the light path, different irradiance distributions are produced on each light entrance facet 100 of the optical integrator 60, as this has been explained above with reference to FIGS. 14 and 15. Consequently also this illumination system 12 is capable of producing different field dependent angular light distributions at mask level, and to vary these angular light distributions by inserting another portion of the diffractive optical element 96.

The use of a pupil defining unit 36 containing a diffractive optical element 96 instead of the mirror array 38 provides less flexibility with respect to the production of different angular light distributions simultaneously on the mask 16. On the other hand, the use of diffractive optical elements 96 for defining the irradiance distribution in the pupil plane 76 is a well-established technology which requires less sophisticated control schemes as compared to the mirror array 38.

b. Combining Pupil Irradiance Distributions

Figure 20:
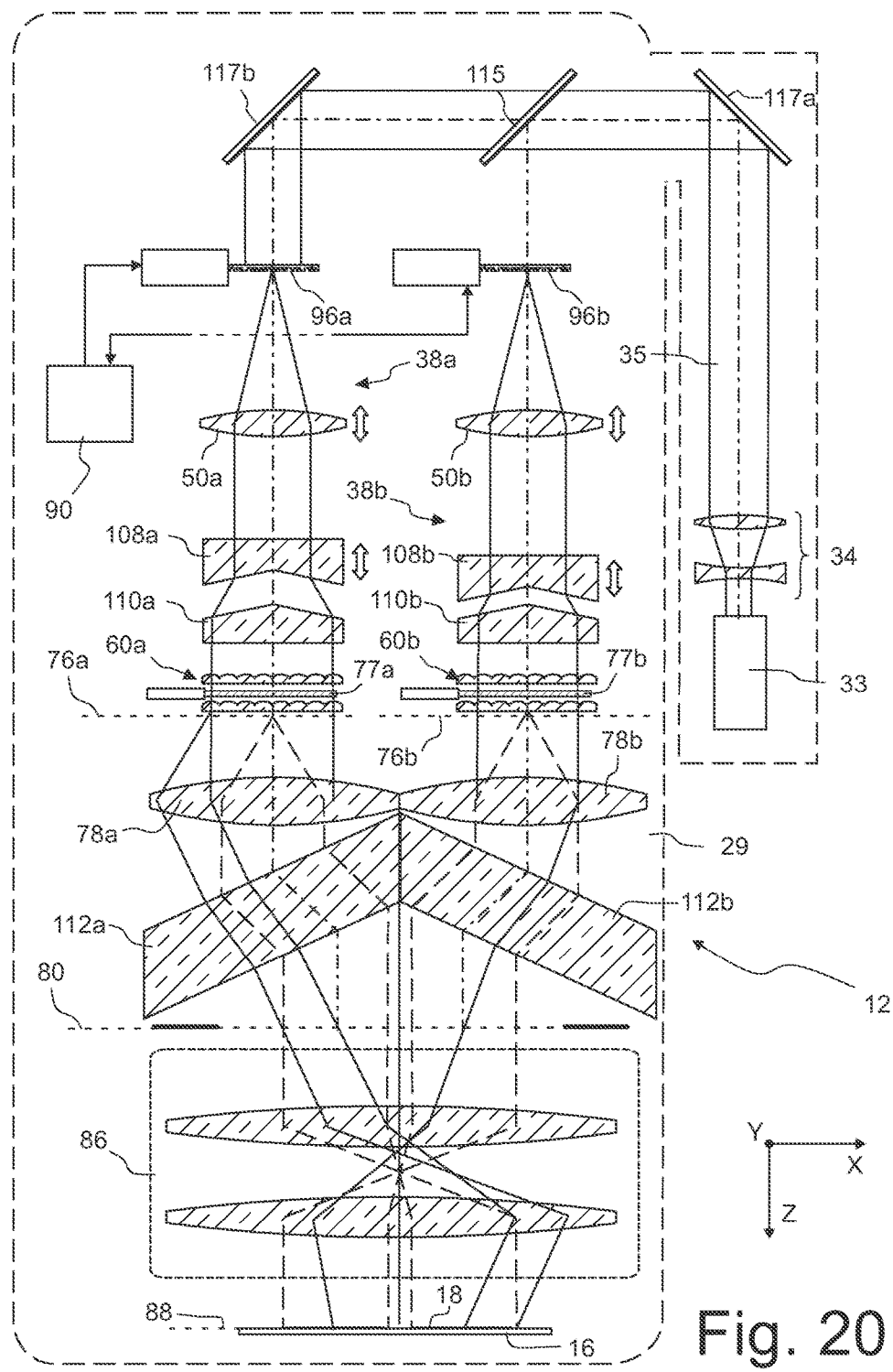
FIG. 20 is a meridional section through an illumination system according to a further alternative embodiment which is also suitable to perform the exposure method illustrated in FIGS. 2 and 3.

FIG. 20 illustrates a different approach that may be used to produce two different angular light distributions simultaneously at different mask pattern areas.

The illumination system 12 shown in FIG. 20 comprises two conventional pupil defining units 38a, 38b each comprising a diffractive optical element 96a and 96b, respectively, a zoom optical system indicated by a lens 50a and 50b, respectively, a pair of axicon elements 108a, 110a and 108b, 110b, respectively, an optical integrator 60a and 60b, respectively, and a polarization manipulator 77a and 77b, respectively. As it is known in the art as such, the axicon elements 108a, 108b and 110a, 110b have complementary conical surfaces. By varying the distance between these surfaces, it is possible to radially shift the light by varying degrees, including no shift at all if the conical surfaces are contact each other.

Two condenser lenses 78a, 78b establish a Fourier relationship between two pupil planes 76a, 76b on the one hand and a common intermediate field plane 80 on the other hand. Prisms 112a, 112b formed by plane parallel plates or formed as rhomboid prisms are used to laterally offset the projection light beams emerging from the optical integrators 60a, 60b so that the fields illuminated by the two pupil planes 76a, 76b combine almost seamlessly in the intermediate field plane 80. Then one half of the field in the intermediate field plane 80 is illuminated by the first pupil plane 76a, and the other half is illuminated by the second pupil plane 76b.

The intermediate field plane 80 is imaged, similar to the embodiments previously described, via an objective 86 on the mask 16.

Since the pupil defining unit 38a, 38b can be controlled individually, it is possible to produce different irradiance distributions in the pupil planes 76a, 76b and thus different angular light distributions on the two halves in the field 14 which is illuminated on the mask 16, as this is illustrated by the ray paths shown in FIG. 20.

In the embodiment shown the diffractive optical elements 96a, 96b are illuminated by a common light source 33. The light emitted by the light source 33 is reflected from a first beam splitting mirror 117a towards a beam splitting mirror 115. The latter directs one half of the light intensity towards a second planar folding mirror 117b, which illuminates the diffractive optical element 96a of the first pupil defining unit 36a, and the other half of the light intensity directly on the diffractive optical element 96b of the second pupil defining unit 36b. However, it may also be envisaged to use two light sources 33 so that each light source 33 in fact illuminates only one half of the field 14 on the mask 16. This has the advantage that twice the light energy is available to expose the light sensitive surface 22, and thus the output of the projection exposure apparatus 10 can also be doubled.

VI

Illumination Systems for Second Embodiment

In the following an illumination system will be described which is capable of producing different angular light distributions on the mask 16 that change very quickly. Such an illumination system is required for carrying out the second embodiment of the double exposure scheme that has been described above with reference to FIGS. 4 and 5.

1. General Construction

Figure 21:
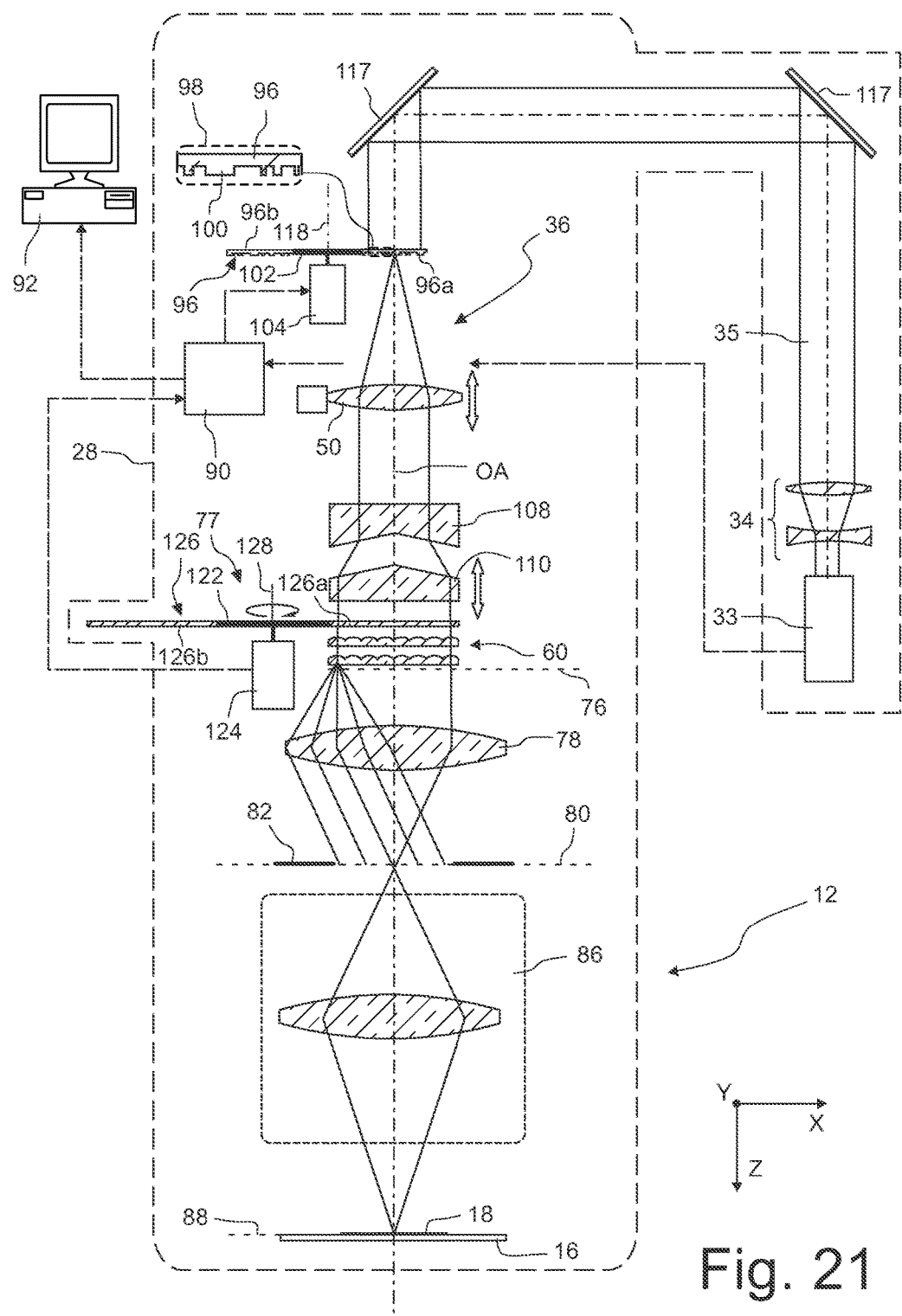
FIG. 21 is a meridional section through an illumination system which is part of the apparatus shown in FIG. 1 and which is suitable to perform the exposure method illustrated in FIGS. 4 and 5 by using a quickly rotating diffractive optical element.

FIG. 21 is a meridional section through an illumination system 12 which is also suitable to be used in the projection exposure apparatus 10 shown in FIG. 1. The illumination system 12 has a similar construction as the illumination system which is shown in FIG. 19.

In this embodiment it is assumed that the light source 33 is configured to emit a train of successive projection light pulses during a scan cycle. The pulse train has an average pulse frequency f which is above 1 kHz, and preferably between 4 and 8 kHz. The term "average frequency" denotes the frequency which is obtained in the average over the entire pulse train. The light source 33 is connected to the control unit 60 such that the latter is able to modify the emission time of the individual light pulses within a single pulse train by a time shift of at least ½f. In other words, the emission times of the individual light pulses can be shortened or delayed within certain limits so that the light pulses may not be emitted perfectly regularly, but in a slightly premature or delayed manner.

The term "time shift" refers to the regular emission time that would be obtained if the pulse train was perfectly periodic. For example, if the average pulse frequency f is 5 kHz, the average time interval between two successive light pulses is 200 µs. The regular emission times are thus also separated by 200 µs. A delay by ½·5 kHz then corresponds to 100 µs. This means that a particular light pulse may be triggered not later than 100 µs after the regular emission time. Thus the possible time interval between two successive light pulses lies in the range between 100 µs and 300 µs.

Similar to the embodiment shown in FIG. 19, the pupil defining unit 36 of this embodiment also comprises a diffractive optical element 96 which is mounted on a turret holder 102 and can be rotated around a rotational axis 118 with the help of a turret drive 104. The rotational axis 118 is aligned parallel to an optical axis OA of the subsequent optical components of the illumination system 12.

However, in contrast to the embodiment shown in FIG. 19, the turret drive 104 is configured to rotate the diffractive optical element 96 very quickly around the rotational axis 118. In the embodiment shown the angular velocity is constant and the rotational frequency is equal to or a multiple integer of the average pulse frequency f of the light source 33. Assuming an average pulse frequency fin the range of a few kHz and a diameter of the diffractive optical element 96 in the range of a few centimeters, this results in a velocity of the circumference of the turret holder 102 close to or even greater than the speed of sound.

The diffractive optical element 96 comprises a first portion 96a and a second portion 96b having different diffractive properties so that the first portion 96a produces, if illuminated by the light pulses, a first irradiance distribution in the pupil plane 76. The second portion 96b produces, if illuminated by the light pulses, a second irradiance distribution in the pupil plane 76 which is distinct from the first irradiance distribution even if the arrangement of optical components between the diffractive optical element 96 and the pupil plane 76 is identical.

These optical elements include a zoom optical system, which is represented by a single lens 50, and a pair of axicon elements 108, 110 whose distance can be varied, as it has been explained above with reference to FIG. 20. With these optical elements it is possible to further vary the irradiance distribution in the pupil plane 76 produced by one of the portions 96a, 96b of the diffractive optical element 96.

The illumination system 12 further comprises a polarization manipulator 77 which is arranged in the beam path between the pair of axicon elements 108, 110 and the subsequent optical integrator 60. The polarization manipulator 77 comprises a polarization manipulating element 126 including a first portion 126a and a second portion 126b that influence the state of polarization differently. The polarization manipulating element 126 is mounted on a turret holder 122 which can be rotated with the help of a turret drive 124 around a rotational axis 128 which is also aligned parallel to the optical axis OA of the illumination system 12. Similar to the turret drive 104 used for the diffractive optical element 96, the turret drive 124 of the polarization manipulator 77 is configured to rotate the polarization manipulating element very quickly around the rotational axis 128 with a constant angular velocity which is equal to or a multiple integer of the average pulse frequency f of the pulse trains emitted by the light source 33.

2. Function and Control of the Illumination System

The function of the illumination system 12 shown in FIG. 21 will now be explained with reference to FIGS. 22a to 22d.

Each of these figures shows on the left side the progress of a scanning cycle in which the illuminated field 14 scans over the first and second mask pattern areas 2181, 2182 in a manner as it has been explained above with reference to FIGS. 4 and 5.

The portion of the figures next to the right is a top view on the diffractive optical element 96 in different rotational positions with respect to the rotational axis 118. A rectangular field 130 indicates the position where the projection light pulses impinge on the rotating diffractive optical element 96. The rotation with constant angular velocity is indicated by an arrow, and the two different portions 96a, 96b of the diffractive optical element 96 having different diffractive properties are represented with different hatching.

The illustration next to the diffractive optical element 96 on the right side is a top view on the rotating polarization manipulating element 126 comprising portions 126a, 126b having a different impact on the state of polarization. Here it is assumed that the first portion 126a transforms impinging circularly polarized light into light that is linearly polarized along the Y direction, and the second portion 126b transforms impinging circularly polarized light into light that is linearly polarized along the X direction. To this end the portions 126a, 126b may comprise birefringent optical materials having a different thickness and suitably aligned optic axes, as this is known in the art as such. A circular area 132 indicates the position where projection light pulses impinge on the polarization manipulating element 126.

The portion on the right side of each figure illustrates the irradiance distribution in the pupil plane 76. The hatched areas indicate poles 27 that are illuminated by the projection light pulses during the scanning operation. The double arrows 134 represent linear states of polarization of projection light passing through illuminated areas in the pupil plane 76.

Figure 22A:
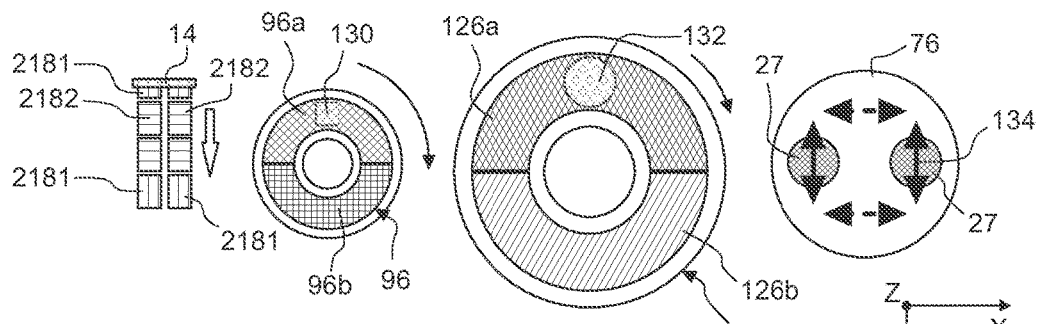
FIGS. 22a to 22d are top views on the light sensitive surface, the quickly rotating diffractive optical element, a quickly rotating polarization manipulating element and the pupil plane at different instances during a scan operation.

FIG. 22a illustrates the conditions that prevail at an instance when first mask pattern portions 2181 are illuminated by the field 14 on the mask 16. The control unit 60 controls the light source 33 and the drive 104 such that the light pulses are perfectly synchronized with the rotation of the diffractive optical element 96. Then each time the light source 33 emits a light pulse the diffractive optical element 96 is in the same rotational position. Here this rotational position is selected such that the field 130 illuminated by a light pulse is positioned approximately in the circumferential center of the first portion 96a of the diffractive optical element 96. This first portion 96a is configured such that it produces, if illuminated by a light pulse, a first irradiance distribution in the pupil plane 76 comprising two poles 27 which are spaced apart along the X direction, as this is illustrated at the right side of the FIG. 22a.

The polarization manipulating element 126 also rotates with a rotational frequency which equals the average frequency f of the pulse train. At the first rotational position shown in FIG. 22a, the area 132 illuminated by the light pulses is located in the first portion 126a. This portion is configured, in this embodiment, such that the projection light is linearly polarized along the Y direction, as this is indicated on the right side by a double arrow 134. This is the optimum state of polarization for imaging structures that are also aligned along the Y direction.

Figure 22B:
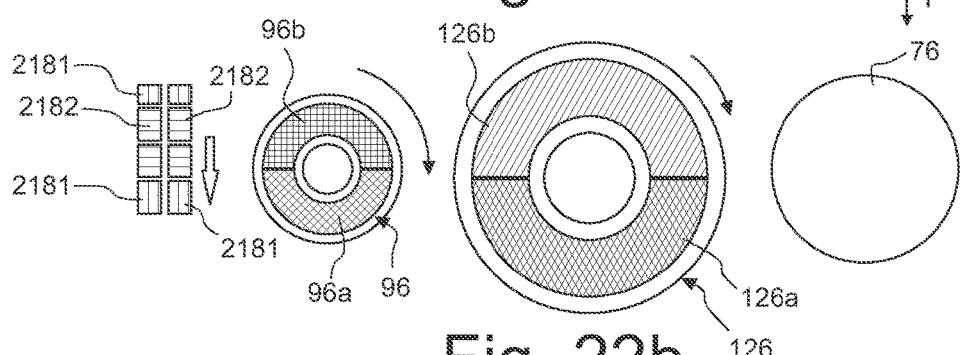

FIG. 22b illustrates the conditions at an instance during the interval which passes until the next light pulse is emitted by the light source 33. Consequently, there are no areas 130, 132 illuminated on the diffractive optical element 96 and the polarization manipulating element 126, respectively. The diffractive optical element 96 and also the polarization manipulating element 126 have been rotated by half a revolution so that the first and secand portions 96a, 96b and 126a, 126b, respectively, have exchanged their positions. However, since no light pulse is emitted, this has no effect on the illumination of the mask 14.

Figure 22C:
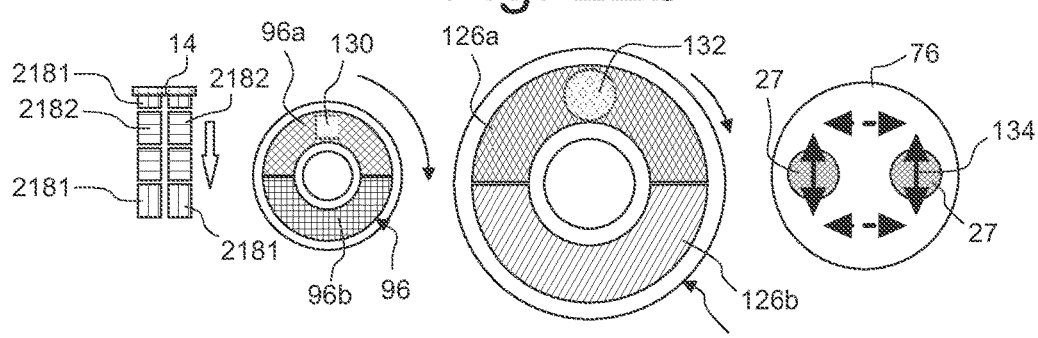
Figure 22D:
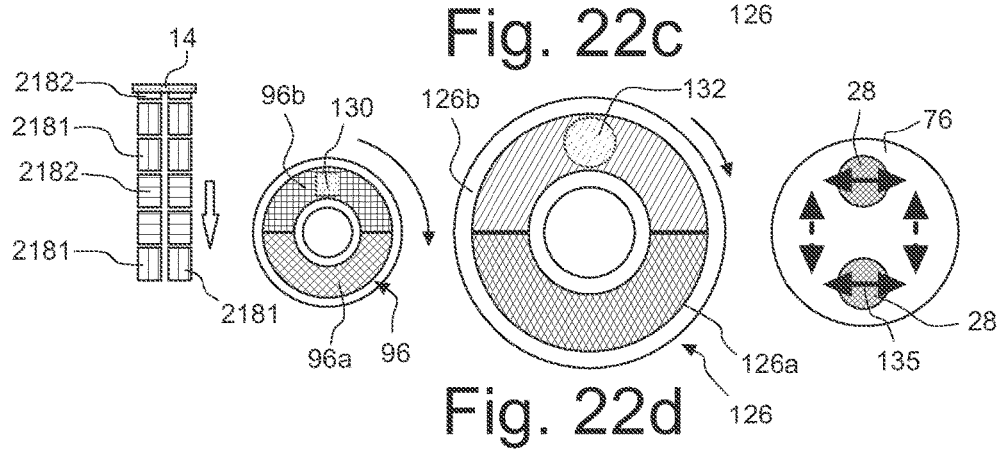

FIG. 22c illustrates the conditions that prevail when the next light pulse is emitted by the light source 33. The mask 14 has moved a bit further, and the diffractive optical element 96 is again in the first rotational position as shown in FIG. 22a; the same applies to the polarization manipulating element 26. Consequently, the irradiance and polarization distribution in the pupil plane 76 are the same as in FIG. 22a.

This synchronization of the light source 33 with the rotation of the diffractive optical element 96 and the polarization manipulating element 126 is maintained as long as the first mask pattern areas 2181 are illuminated.

If the second mask pattern areas 2182 shall be imaged on the light sensitive layer 22, the angular light distribution must change very quickly to a Y dipole illumination setting as shown in FIG. 4. Then two poles 28 have to be spaced apart along the Y direction, see the right side of FIG. 22d. Furthermore, the projection light should be linearly polarized along the X direction, as it is indicated in this figure by double arrows 135.

This quick change of the illumination setting is achieved by delaying all subsequent light pulses by half a pulse period, i.e. by ½f. This implies that only once the emission time between two successive light pulses is increased by ½f. All later light pulses are emitted again with the average frequency f. After the pulse period has been increased once by ½f, the diffractive optical element 96 will, each time a light pulse is emitted, be in its second rotational position in which the illuminated area 130 is positioned on the second portion 96b of the diffractive optical element 96. The second portion is configured to produce a second irradiance distribution in the pupil plane 76 which is distinct from the first irradiance distribution in that the poles 28 are not spaced apart along the X direction, but along the Y direction.

The delay of the emission time has a similar effect on the state of polarization. Now the polarization manipulating element 126 will be in its second rotational position each time a light pulse is emitted. Thus the area 132 illuminated by the light pulses is located in the second portion 126a, which is configured such that the projection light emerging from this portion is linearly polarized along the X direction, as this is indicated on the right side by a double arrow 134. This is the optimum state of polarization for imaging structures that are also aligned along the X direction.

If the illumination of the second mask pattern areas 2182 is terminated and the illumination setting shall be changed back to an X dipole illumination setting, the light pulses are not delayed any more. This implies that all later light pulses are emitted again with the average frequency f.

Figure 23:
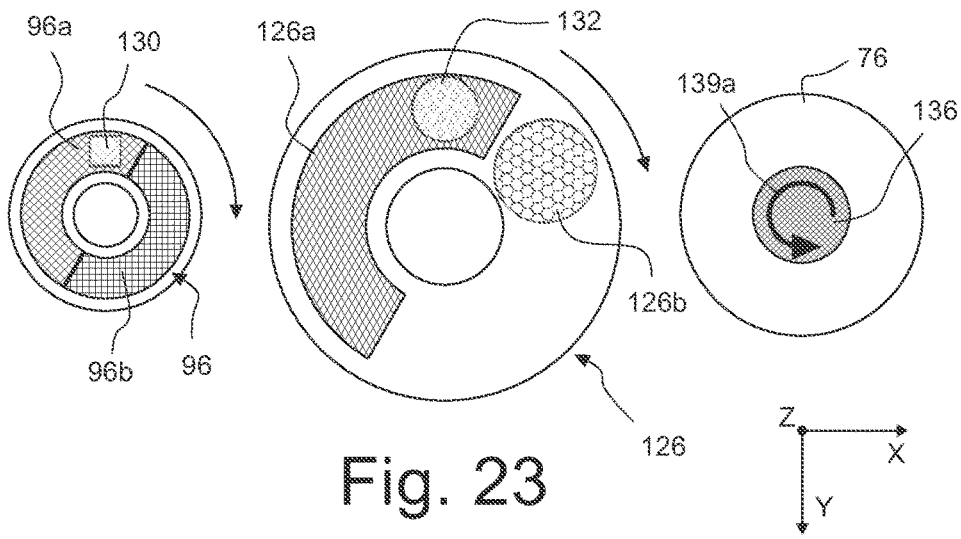
FIG. 23 is a top view on a quickly rotating diffractive optical element, a quickly rotating polarization manipulating element and the pupil plane according to an alternative embodiment.
Figure 24:
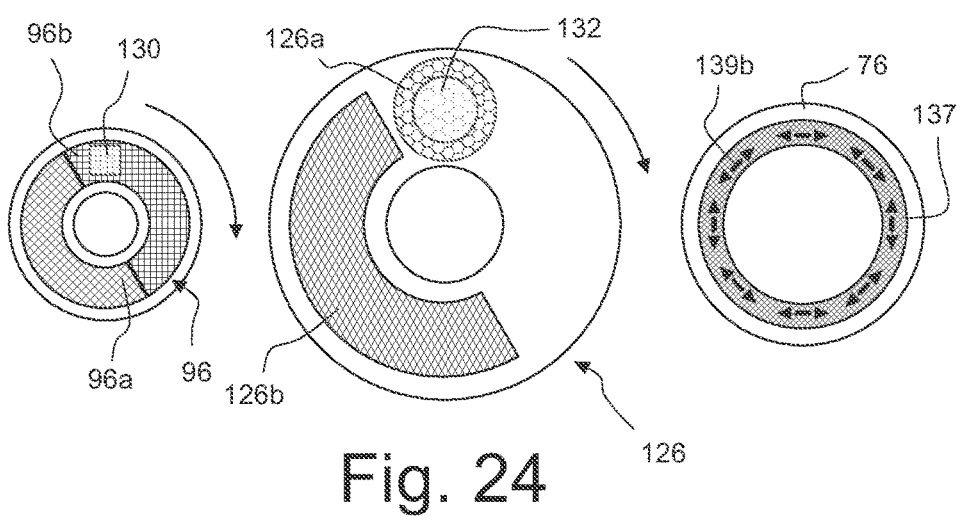
FIG. 24 is a top view on a quickly rotating diffractive optical element, a quickly rotating polarization manipulating element and the pupil plane according to a still further alternative embodiment.

By replacing the diffractive optical element 96 and the polarization manipulating element 126 by elements having different optical properties, it is possible to change very quickly between almost any arbitrary angular light and polarization distribution at mask level. This is shown in FIGS. 23 and 24 which illustrate, in representations similar to FIGS. 22a to 22d, two different instances during a scan cycle. Here is assumed that the first portion 96a of the diffractive optical element 96 produces a conventional illumination setting in which the illuminated portion in the pupil plane 76 has the shape of a circular disk 136 (see FIG. 23). The second irradiance distribution, which is produced if the second portion 96b of the diffractive optical element 96 is illuminated by a light pulse, corresponds to an annular illumination setting in which an annular area 137 is illuminated in the pupil plane 76 (FIG. 24). With such a diffractive optical element 96 it is thus possible to change between the conventional setting shown on the right side of FIG. 23 and the annular illumination setting shown on the right side of FIG. 24 very quickly between two successive light pulses of a single pulse train emitted by the light source 33.

The time shift which is necessary to change between illumination of the first portion 96a and the second portion 96b is reduced in this embodiment from ½f to ⅙f by arranging the first and second rotational positions of the diffractive optical element 96 to be separated by 60° instead of 180°.

In this embodiment the polarization manipulating element 126 comprises a first portion 126a which is configured to produce circularly polarized light (see arrow 139a) if the impinging light pulses are linearly polarized along a given direction. Then the first portion 126a may be formed by a quarter-wave plate, for example. The second portion 196b is configured to produce a tangential polarization distribution, as it is indicated by double arrows 139b on the right side of FIG. 24. Such a tangential polarization distribution may be achieved if the second portion 126b is assembled from a plurality of birefringent elements which are oriented in different directions, as it is disclosed in US 2002/0176166 A1. If the polarization manipulating element 126 rotates with the same angular frequency as the diffractive optical element 96, the irradiance distribution and also the polarization distribution in the pupil plane 76 can be changed simultaneously between successive light pulses if a light pulse is delayed by ⅙f.

3. Alternative Embodiments

In the embodiments shown in FIGS. 21 to 24 the angular frequency of the diffractive optical element 96 and the polarization manipulating element 126 has been equal to the pulse frequency for an integer multiple thereof. This requires, on the one hand, high angular velocities of the diffractive optical element 96 and the polarization manipulating element 126, and on the other hand also a relatively large time shifts if the irradiance distribution and the polarization distribution in the pupil plane 76 shall change.

a. Alternating Portions

Figure 25:
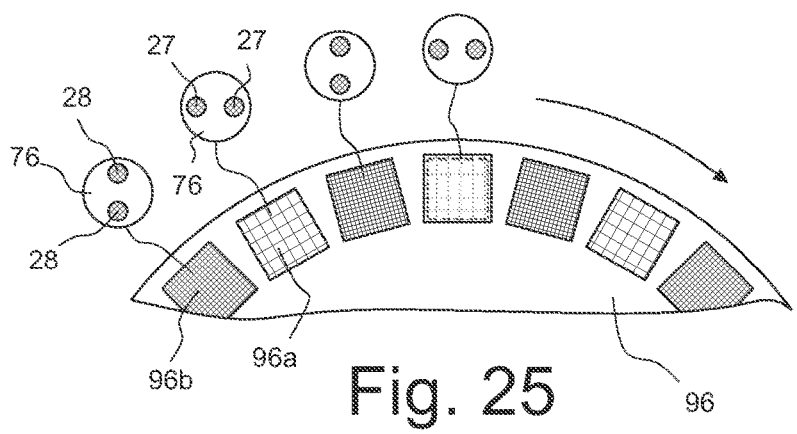
FIG. 25 is a top view on a portion of a quickly rotating diffractive optical element comprising a plurality of alternating first and second portions.

FIG. 25 illustrates an embodiment of a diffractive optical element 96 in which a plurality of first portions 96a and an equal number of second portions 96b are arranged alternately along the circumference of the diffractive optical element 96. Here it is again assumed that each first portion 96a produces an X dipole illumination setting with poles 27 and each second portion 96b a Y dipole illumination setting with poles 28, as it is illustrated in FIG. 25 in pupil planes 76 shown above the diffractive optical element 96.

If there are n first portions 96a and n second portions 96b, the angular frequency of the diffractive optical element 96 can be reduced by a factor of 1/n with respect to the average pulse frequency f of the light source 33. Furthermore, the first angular positions, in which one of the first portions 96a is illuminated by a light pulse, and the second rotational positions, in which one of the second portions 96b is illuminated by a light pulse, are now separated not by 180° but by 180°/n. Then a change between the first and the second rotational position can be accomplished with a time shift which is only ½nf. Assuming a pulse frequency f=5 kHz and a diffractive optical element 96 having 16 first portions 96a and 16 second portions 96b, the time shift which is required to change between the two illumination settings associated with the first and second portions 96a, 96b is only 6.25 μs, which is about 3% of the regular period between two successive light pulses of 200 μs. Smaller time shifts of the emission times of individual light pulses have a favorable effect on the performance of the light source 33 if the latter is formed by an excimer laser, as this will typically be the case.

b. Multiple Illumination Settings

FIG. 26 is a top view on a diffractive optical element 96 according to a further embodiment. Unlike the embodiment shown in FIGS. 22 to 24, the diffractive optical element 96 does not comprise only two, but 10 different portions 96a to 96j. Each portion produces, if illuminated by a light pulse, a different irradiance distribution in the pupil plane 76. For that reason the portions 96a to 96j are represented in FIG. 26 by the irradiance distribution which is produced in the pupil plane 76 by illuminating the respective portion.

If the rotational frequency of the diffractive optical element 96 is equal to the average pulse frequency f of the light source 33 (or to an integer multiple thereof), it is possible to produce any of the irradiance distributions associated with the portions 96a to 96j in the pupil plane 76. It is then only necessary to control the emission time of the individual light pulses so that each light pulse illuminates, during the rotation of the diffractive optical element 96, each time the same desired portion. For example, if it is desired to produce in the pupil plane 76 the irradiance distribution shown in FIG. 27, the light pulses have to be emitted by the light source 33 each time the portion 96h, which is configured to produce this particular irradiance distribution and is therefore shown in FIG. 26 with a gray shading, intersects the path of the light pulses in the illumination system 12.

If it turns out that the poles 28 in the pupil plane 76 should be smaller or larger for enabling an optimum transfer of the mask pattern 18 on the light sensitive surface 22, the emission time may be modified so that one of the other portions 96d, 96i or 96j is illuminated by the light pulses while the diffractive optical element 96 rotates with constant angular velocity.

c. Scan Integrated Pupil Filling

The number of different portions which are available on the diffractive optical element 96 is necessarily restricted. Particularly, if more complex irradiance distributions shall be produced in the pupil plane 76, this may make it necessary to provide a number of different diffractive optical elements each comprising a number of portions having different diffractive properties.

Another way of being able to produce a wide variety of different irradiance distributions in the pupil plane 76 is based on the consideration that the entire irradiance distribution in a pupil plane 76 does not have to be produced by each light pulse. Instead, it suffices that during the entire time interval, for which a certain point on the mask 16 is illuminated by light pulses, the desired irradiance distribution in the pupil plane 76 is produced. In other words, the light pulses produce only portions of the desired irradiance distribution in the pupil plane 76, and the entire irradiance distribution is assembled from these portions during the scan process. This is sometimes also referred to as "scan integrated pupil filling".

FIG. 28 is a top view on a diffractive optical element 96 according to an embodiment in which there are again 10 portions 96a to 96j each producing a different irradiance distribution in the pupil plane 76 as indicated. This diffractive optical element 96 is particularly configured to produce different C squad illumination settings. Such an illumination setting is a combination of an X dipole setting with two poles 27, a Y dipole setting with two poles 28 and a small conventional setting with a central pole 25, as it is exemplarily shown in FIG. 29.

If the three grey shaded portions 96b, 96f and 96i are illuminated alternately by the light pulses during a single rotation of the diffractive optical element 96 by 360° (preferably with constant angular velocity), the scan integrated irradiance distribution shown in FIG. 29 is obtained in the pupil plane 76, since each of the three portions 96b, 96f, 96i produces a different irradiance distribution in the pupil plane 76.

If the size of the areas in this irradiance distribution shall be changed, it is only necessary to modify the emission time of some of the light pulses. For example, if the size of the poles 27 spaced apart along the X direction shall be reduced, the emission time of the light pulses have to be modified so that not the portion 96b, but the portion 96c or 96d is illuminated.

d. Continuously Modifying the Illumination Setting

Figure 30:
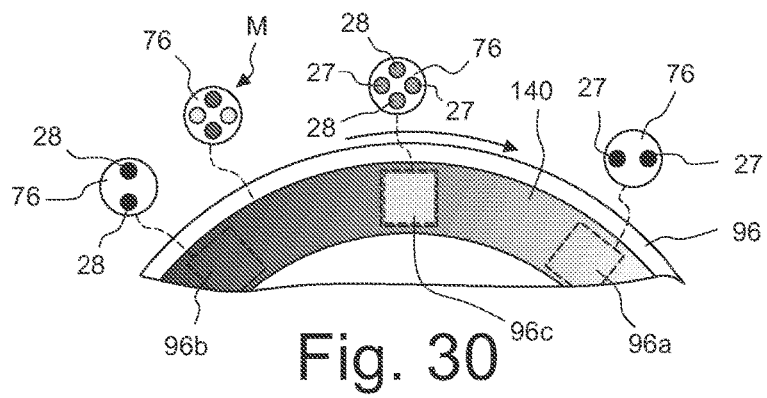
FIG. 30 is a top view on a portion of a quickly rotating diffractive optical element comprising a circular ring a producing continuously varying irradiance distribution in the pupil plane.

FIG. 30 illustrates an embodiment of a diffractive optical element 96 wherein portions producing different irradiance distributions in the pupil plane 76 form a continuous circular ring 140 which is centered with respect to the rotational axis 118 of the diffractive optical element 96. The diffractive effect produced by the ring 140 changes continuously along at least a part of the circumference. Therefore the ring 140 has virtually an infinite number of rotational positions in which different irradiance distributions are produced in the pupil plane 76.

In FIG. 30 three portions 96a, 96b and 96c are indicated with dashed lines. The first portion 96a produces, if illuminated by the light pulses, a Y dipole illumination setting with poles 27, as it is indicated in FIG. 30. The second portion 96b produces, if illuminated by the light pulses, an X dipole illumination setting with poles 28. The third portion 96c, which is arranged between the first portion 96a and the second portion 96b, produces a mixture of an X dipole illumination setting and a Y dipole illumination setting, which results in a quadrupole illumination setting with four poles 27, 28. Since the irradiated area in the pupil plane is then twice as large if compared to the dipole illumination settings, the intensity of each pole 27, 28 is reduced by a factor of 2. This is indicated in FIG. 30 by a grey shading of the poles 27, 28 produced by the third portion 96c.

Portions between the first portion 96a and the third portion 96c and also between the second portion 96b and the third portion 96c produce irradiance distributions in the pupil plane 76 in which the irradiance of the poles in the pupil plane 76 is continuously shifted from the poles 27 to the poles 28, or vice versa, as this is indicated by an irradiance distribution M in the pupil plane 76.

The diffractive optical element 96 shown in FIG. 30 is thus capable of producing not only different shapes of the irradiated areas in the pupil plane 76, but also irradiance distributions which differ only with respect to the irradiance of areas having the same shape. This may be used, for example, two adjust the telecentricity and pole balance of the illumination setting.

e. Combination with Fixed Diffractive Optical Element

In the embodiments shown in FIGS. 26 to 30 the quickly rotating diffractive optical element 96 is not only capable to produce entirely different irradiance distributions in the pupil plane 76, but also to modify a given irradiance distribution slightly, for example by changing the shape and/or irradiance of the poles 27, 28.

A quickly rotating diffractive optical element 96 may also be used exclusively to modify or correct a basic irradiance distribution in the pupil plane. The basic irradiance distribution may then be produced by conventional pupil defining means, for example a fixed diffractive optical element combined with a zoom optical system and a pair of axicon elements.

Figure 31:
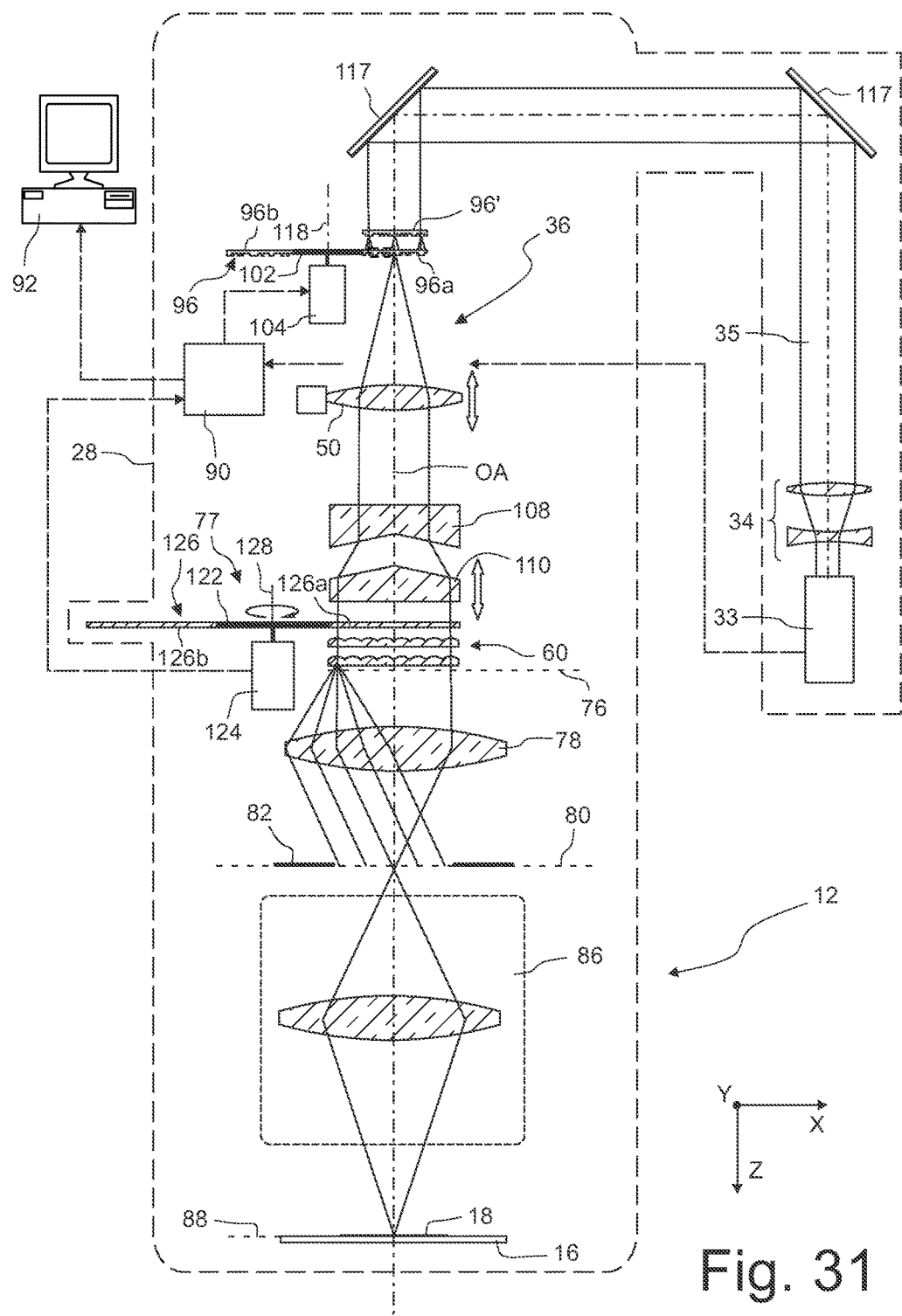
FIG. 31 is a meridional section through an illumination system which is part of the apparatus shown in FIG. 1 comprising a stationary diffractive optical element and a quickly rotating diffractive optical element.

FIG. 31 shows, in a meridional section similar to FIG. 21, an illumination system 12 which is substantially identical to the illumination system 12 shown in FIG. 21. The only difference is that an additional stationary diffractive optical element 96' is arranged in the immediate vicinity to the quickly rotating diffractive optical element 96. Alternatively, the two diffractive optical elements 96, 96' may be arranged in optically conjugate planes, for example at the object and image plane of an imaging optical system. With such an arrangement, or with the arrangement shown in FIG. 31, the irradiance distribution produced by the two diffractive optical elements 96, 96' in the pupil plane 76 can be mathematically described as convolution of the irradiance distributions that are individually produced by the stationary diffractive optical element 96' and the irradiance distributions that are produced by the different portions of the quickly rotating diffractive optical element 96.

Figures 32A, 32B, 32C:
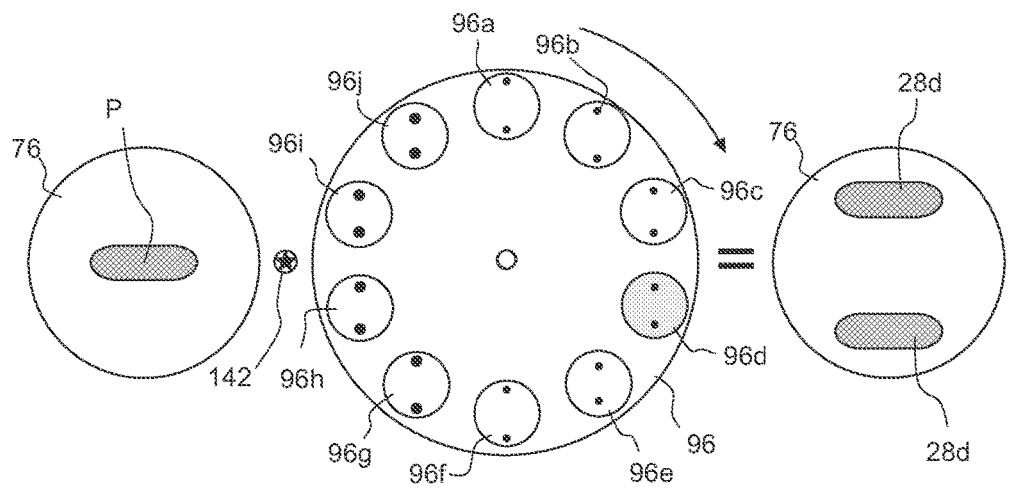
FIGS. 32a to 32c illustrate the convolution of an irradiance distribution produced by the stationary diffractive optical element and an irradiance distribution produced by the quickly rotating diffractive optical element in a first angular position.

This is illustrated in FIGS. 32 and 33. FIG. 32a shows an exemplary irradiance distribution comprising a single pole P which is produced by the stationary diffractive optical element 96' in the pupil plane 76. FIG. 32b shows in a schematic representation the different irradiance distributions which can be produced by portions 96a to 96i of the quickly rotating diffractive optical element 96. The portions 96a to 96i differ from one another in that they produce irradiance distributions in the pupil plane 76 that consist basically of only two small spots that are spaced apart along the Y direction by different distances, and with two different spot sizes available.

If, for example, the emission time of the light pulses is controlled such that only the portion 96d is illuminated by the light pulses, an irradiance distribution in the pupil plane 76 as shown in FIG. 32c is obtained. This irradiance distribution can mathematically be described in the convolution (indicated by symbol 142) of the irradiance distribution shown in FIG. 32a and the irradiance distribution associated with the portion 96d shown in FIG. 32b. It can be seen that the pole P produced by the stationary diffractive optical element 96' is doubled so that two poles 28d appear at different positions in the pupil plane 76.

Figures 33A, 33B, 33C:
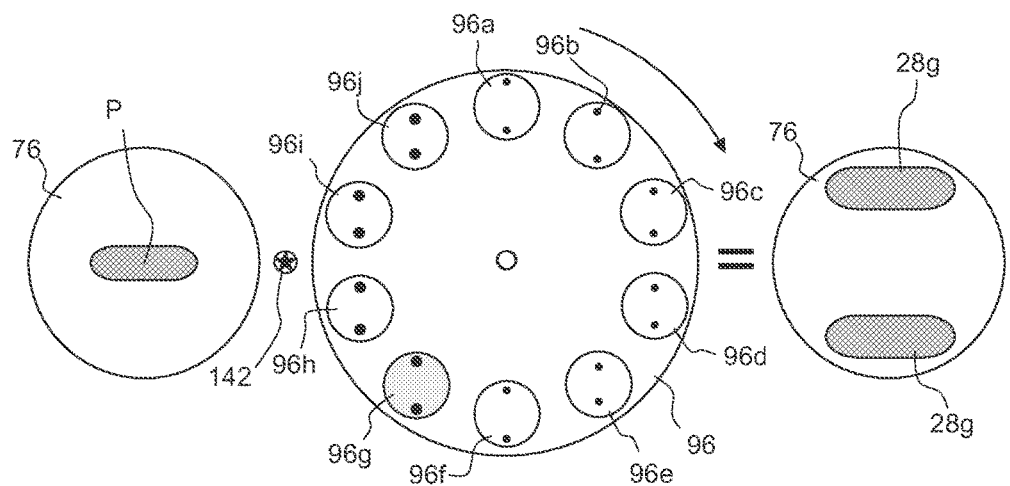
FIGS. 33a to 33c illustrate the convolution of the irradiance distribution produced by the stationary diffractive optical element and an irradiance distribution produced by the quickly rotating diffractive optical element in a second angular position.

If, for example, the emission time of the light pulses is controlled such that the light pulses illuminate the portion 96g, which produces two larger spots spaced apart by a maximum distance along the Y direction, the convolution with the basic irradiance distribution shown in FIG. 31a results in an irradiance distribution as it is shown in FIG. 33c. In comparison to FIG. 32c the two poles 28g are slightly larger and have a larger distance along the Y direction.

This approach may also be used to correct telecentricity or pole balance errors of a given illumination setting. These terms relate to the spatial energy distribution in the pupil plane 76. If the energy distribution in the pupil plane 76 does not fulfill certain symmetry requirements, telecentricity or pole balance errors occur. For example, if in a quadrupole illumination setting the poles spaced apart along the X direction are brighter than the poles spaced apart along the Y direction, this asymmetry is referred to as pole balance error. Violation of such symmetry requirements in the pupil plane 76 may cause various undesired effects. For example, the images of features 19 having identical shapes and sizes, but different orientations, may then have a different size.

Figures 34A, 34B, 34C:
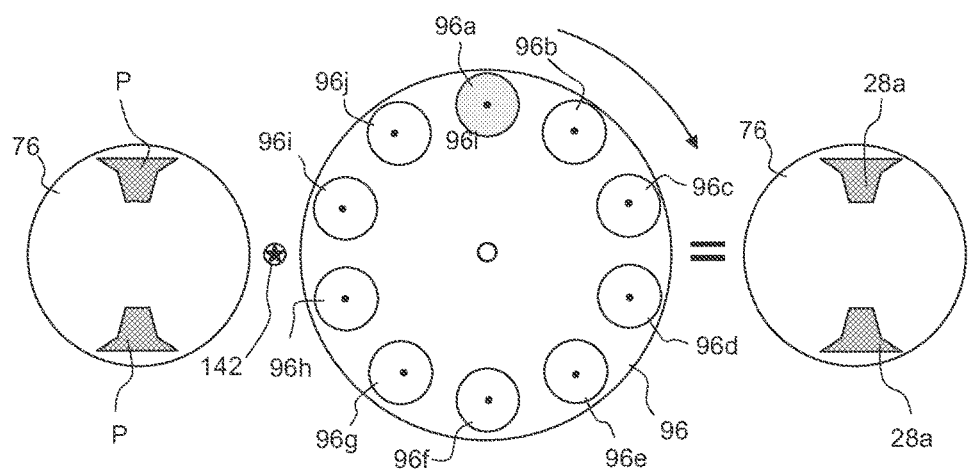
FIGS. 34a to 34c illustrate the convolution of an irradiance distribution produced by the stationary diffractive optical element and an irradiance distribution produced by the quickly rotating diffractive optical element in a first angular position according to another embodiment.

FIG. 34a shows on the left side an irradiance distribution which is produced by the stationary diffractive optical element 96' in the pupil plane 76 in the absence of the quickly rotating diffractive optical element 96. The two poles P have a shape that is particularly adapted to the features that shall be imaged.

In the absence of the quickly rotating diffractive optical element 96, or if a portion 96a is illuminated that does not modify the angular distribution of light passing through, one would expect that the irradiance distribution shown in FIG. 34a is obtained in the pupil plane 76. However, for various reasons this may not be the case. These reasons include imperfections of the stationary diffractive optical element 96', fluctuations of the direction of the projection light beam 35 impinging on the stationary diffractive optical element 96', and also aberrations associated with optical elements that are arranged between the stationary diffractive optical element 96' and the pupil plane 76.

Here it is assumed that the irradiance distribution which is finally obtained in the pupil plane 76 looks like what is shown in FIG. 34c. It can be seen that the poles 27a have the desired shape and size, but they are slightly displaced along the +X direction. This causes a telecentricity error, because now more light impinges from the +X direction on points on the mask 16 than from the −X direction.

Figures 35A, 35B, 35C:
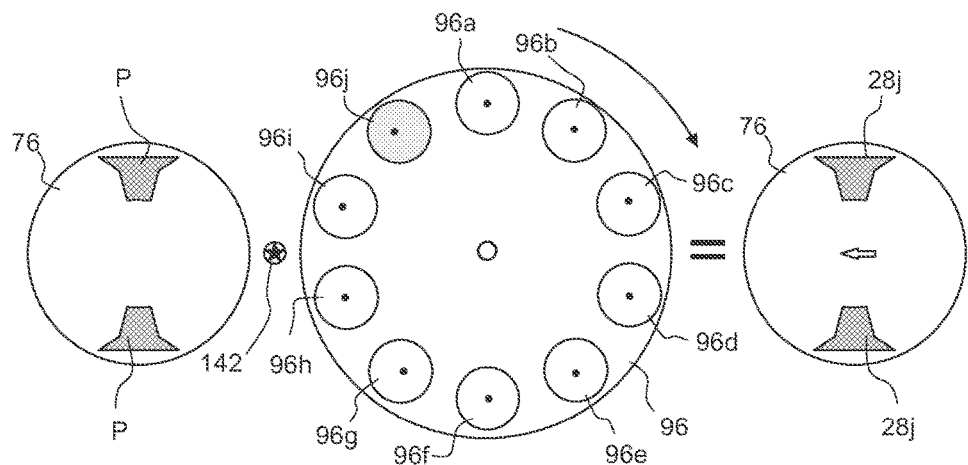
FIGS. 35a to 35c illustrate the convolution of the irradiance distribution produced by the stationary diffractive optical element and an irradiance distribution produced by the quickly rotating diffractive optical element in a second angular position according to the other embodiment.

Such a telecentricity error may be detected by measuring the angular light distribution in the mask plane 88 or the spatial irradiance distribution in the pupil plane 76, for example. The emission times of the light pulses may then be modified so that not the portion 96a, but the portion 96j of the quickly rotating diffractive optical element 96 is illuminated by the light pulses. The portion 96j produces, if illuminated by projection light, an irradiance distribution in the pupil plane 76 consisting of a small spot which is slightly displaced along the −X direction. Convolution of such an irradiance distribution with the basic irradiance distribution shown in FIGS. 34a and 35a has the result that the latter is slightly shifted along the −X direction, as it is indicated in FIG. 35c by an arrow. Now the poles 27i are perfectly aligned along the Y direction so that an equal amount of projection light impinges from the +X and −X direction on the mask 14.

Since the quickly rotating diffractive optical element 96 comprises a large number of portions 96a to 96i which can be used to shift the irradiance distribution by small amounts along the +X and −X as well as the +Y and −Y direction, it is possible to optimize the illumination setting with a view to telecentricity and pole balance by simply modifying the emission time of the light pulses while the diffractive optical element 96 rotates with constant angular velocity. It should further be apparent that due to the quick rotation of the diffractive optical element 96, adjustments of the illumination setting can be performed extremely fast. This makes it possible to adjust the illumination setting quickly if different mask pattern areas 181, 182 require a different amount of adjustment.

f. Interleaving Pulse Trains

The combination of the quickly rotating diffractive optical element 96 with a stationary diffractive optical element 96' can also be used to interleave two light pulse trains so that the effective pulse rate is doubled.

Figure 36:
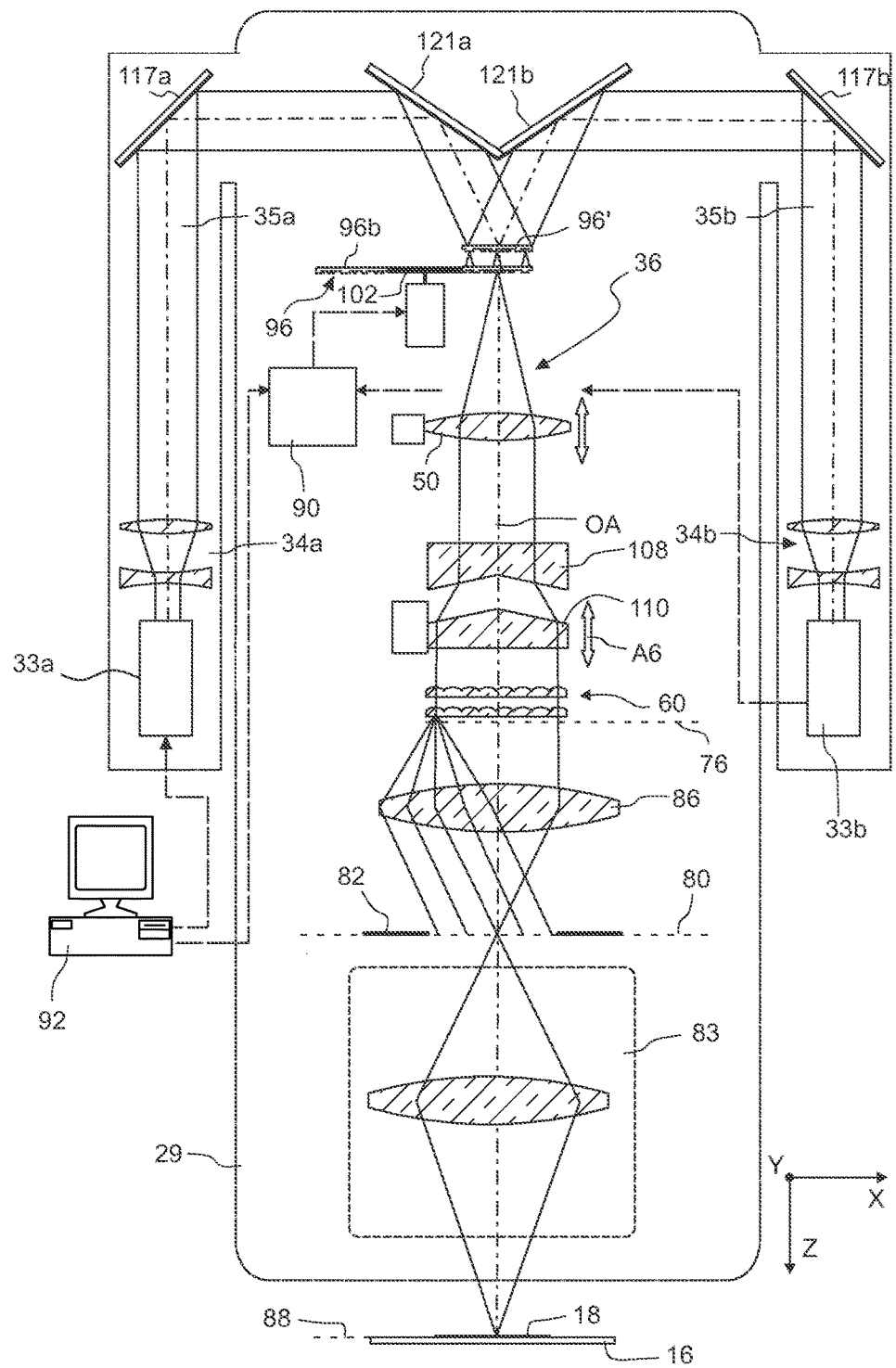
FIG. 36 is a meridional section through an illumination system which is part of the apparatus shown in FIG. 1 comprising a stationary diffractive optical element and a quickly rotating diffractive optical element and two light sources.

This is illustrated in FIG. 36 showing an illumination system 12 which differs from the illumination system shown in FIG. 31 only in that there are not only one light source 33, but two light sources 33a, 33b, two beam expansion units 34a, 34b, two first plane folding mirrors 117a, 117b and two second plane folding mirrors 121, 121b. The second folding mirrors 121a, 121b direct the projection light beams 35a, 35b towards the stationary diffractive optical element 96'. As a result of the oblique incidence, the irradiance distribution produced by the stationary diffractive optical element 96' in the pupil plane 76 will thus be shifted to the +X or the −X direction depending on whether the light pulse has been produced by the light source 33a or the light source 33b. Since each light pulse shall produce the same irradiance distribution irrespective of its origin, the quickly rotating diffractive optical element 96 is used to compensate the shift of the irradiance distributions that results from the oblique incidence. This will now be explained with reference to FIGS. 37a-37c and 38a-38c.

FIG. 37a illustrates the irradiance distribution that would be produced in the pupil plane 76 by the stationary diffractive optical element 96 if it is illuminated by a light pulse emitted by the first light source 33a and in the absence of the quickly rotating diffractive optical element 96. The irradiance distribution comprises two poles P which are, however, shifted towards the +X direction as a result of the oblique incidence. This lateral offset is compensated by the quickly rotating diffractive optical element 96. If light pulses impinge obliquely on the portion 96g of the diffractive optical element 96, this portion tilts the light beam 35a towards the −X direction, and this offsets the tilt produced by the oblique incidence.

Mathematically speaking, the convolution of the irradiance distribution shown in FIG. 37a with the irradiance distribution, which is produced in the pupil plane 76 by the portion 96f of the quickly rotating diffractive optical element 96 if illuminated by light pulses produced by the first light source 33a, results in an irradiance distribution as shown in FIG. 37c in which two poles 28g are centered with respect to the X direction.

The emission time of the next light pulse, which is emitted by the second light source 33b, is controlled by the control unit 90 such that it illuminates the portion 96a of the quickly rotating diffractive optical element 96. The portion 96b shifts the irradiance distribution in the opposite direction, i.e. the +X direction. This offsets the shift of the irradiance distribution shown in FIG. 38a which is a result of the oblique incidence of the light pulse on the stationary diffractive optical element 96'.

The quickly rotating diffractive optical element 96 may comprise portions that tilt the incoming light by different degrees along the +X and −X direction so that also telecentricity and pole balance errors may be corrected, as it has been described above with reference to FIGS. 34 and 35.

VII

Illumination Systems for Third Embodiment

In the following an illumination system will be briefly described which is capable of producing two different illumination settings at different portions of the illuminated field 14 on the one hand, and also to change the illumination settings very quickly between exposure of mask pattern areas that are arranged one behind the other along the scan direction. Such an illumination system is required for carrying out the third embodiment of the double exposure scheme that has been described above with reference to FIGS. 6 and 7.

An illumination system which is capable to perform this task is almost identical to the illumination systems shown in FIG. 21. The only modification is that the portions 96a, 96b of the quickly rotating diffractive optical element 96 have to be designed such that more complex irradiance distributions can be produced on the light entrance facets 100, as this has been explained above with reference to the embodiment shown in FIG. 21 and FIG. 15. These irradiance distributions result in different illumination settings at different positions on the mask, while the quickly rotating diffractive optical element 96 makes it possible to change these illumination settings very quickly.

VIII

Important Method Steps

Figure 39:
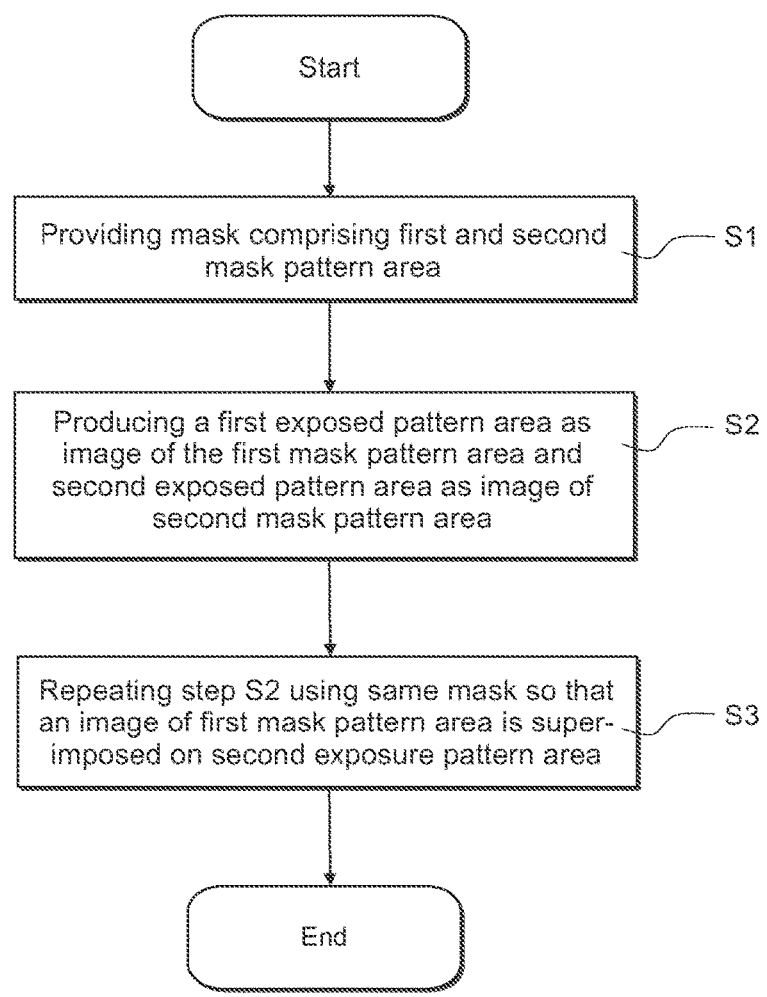
FIG. 39 is a flow diagram illustrating important method steps of the invention.

In the following important method steps in accordance with the present invention will be explained with reference to the flow diagram shown in FIG. 39.

In a first step S1 a mask comprising first and second mask pattern areas is provided.

In a second step S2 a first exposed pattern area is exposed as image of the first mask pattern area and a second exposed pattern area is produced as image of the second mask pattern area.

In a third step S3 the step S2 is repeated using the same mask so that an image of the first mask pattern area is superimposed on the second exposure pattern area. The projection light illuminating the first mask pattern area has a first angular light distribution, and the projection light illuminating the second mask pattern area has a second angular light distribution which is different from the first angular light distribution.

IX

Important Features of the Invention

Important features of the invention are summarized in the following sentences:

1. A method of lithographically transferring a pattern (18) on a light sensitive surface (22) in a multiple exposure process, the method comprising the following steps:
    a) providing a mask (16; 216; 316) comprising a first mask pattern area (181; 2181; 3181) and a second mask pattern area (182; 2182; 3182);
    b) directing projection light on the mask, thereby producing on the light sensitive surface a first exposed pattern area (301; 2301; 3301), which is an image of the first mask pattern area (181; 2181; 3181), and a second exposed pattern area (302; 232; 3302), which is an image of the second mask pattern area (182; 2182; 3182);
    c) repeating step b) using the same mask (16; 216; 316) so that an image of the first mask pattern area (181; 2181; 3181) is superimposed on the second exposure pattern area (302; 232; 3302),
    wherein the projection light illuminating the first mask pattern area (181; 2181; 3181) has a first angular light distribution, and the projection light illuminating the second mask pattern area (182; 2182; 3182) has a second angular light distribution which is different from the first angular light distribution.

2. The method of sentence 1, wherein the projection light is directed simultaneously on the first mask pattern area (181; 3181) and the second mask pattern area (182; 3182) during step b).

3. The method of sentence 2, wherein the mask (16; 316) moves along a scan direction (Y) during step b) so that an illuminated field (14) scans over the first mask pattern area (181; 3181) and the second mask pattern area (182; 3182), and wherein the first mask pattern area and the second mask pattern area are arranged side by side along a cross scan direction (X) which is perpendicular both to the scan direction and to a normal on the mask (16; 316).

4. The method of sentence 3, wherein, during step b), only an image of the first mask pattern area (181; 3181) is superimposed on the second exposure pattern area (302; 3302).

5. The method of sentence 4, wherein the light sensitive surface (22) is displaced along the cross scan direction (X) between step b) and step c).

6. The method of sentence 1, wherein the projection light is first directed on the first mask pattern area (2181) and subsequently on the second mask pattern area (2182) during step b).

7. The method of sentence 6, wherein the mask (216) moves along a scan direction (Y) during step b) so that an illuminated field (14) scans over the first mask pattern area (2181) and the second mask pattern area (2182), and wherein the first mask pattern area (2181) and the second mask pattern area (2182) are arranged one behind the other along the scan direction (Y).

8. The method of sentence 7, wherein, during step c), an image of the second mask pattern area (2182) is superimposed on the first exposure pattern area (2301).

9. The method of sentence 8, wherein the light sensitive surface (22) is displaced along the scan direction (Y) between step b) and step c).

10. The method of any of the preceding sentences, wherein the mask (316) comprises additionally a third mask pattern area (3183),
    an image of the third mask pattern area (3183) is superimposed both on the first exposure pattern area (3301) and on the second exposure pattern area (3302),
    the projection light illuminating the third mask pattern area (3183) has a third angular light distribution which is different from the first angular light distribution and from the second angular light distribution.

11. The method of sentence 10, wherein
    the mask (316) comprises additionally a fourth mask pattern area (3184),
    an image of the fourth mask pattern area (3184) is superimposed on the first exposure pattern area (3301), on the second exposure pattern area (3302) and on the third exposure pattern area (3303), the projection light illuminating the fourth mask pattern area (3304) has a fourth angular light distribution which is different from the first angular light distribution, from the second angular light distribution and from the third angular light distribution.

12. The method of sentence 11, wherein
simultaneously to producing the first exposed pattern area (3301) during step b), the second exposed pattern area (3302) is produced on the light sensitive surface (22),
simultaneously to producing a third exposed pattern area (3303), which is an image of the third mask pattern area (3183), a fourth exposed pattern area (3304), which is an image of the fourth mask pattern area (3184), is produced on the light sensitive surface (22),
simultaneously to superimposing an image of the third mask pattern area (3183) on the first exposure pattern area (3301) during step c), thereby producing a combined first plus third mask pattern area (3301+3303), superimposing an image of the fourth mask pattern area (3184) on the second exposed pattern area (3302), thereby producing a combined second plus forth mask pattern area (3302+3304),
wherein the method comprises the following additional steps d) and e):
d) alternately superimposing an image of the first mask pattern area (3181) on the combined second plus forth mask pattern area (3302+3304), thereby producing a combined first plus second plus forth mask pattern area (3301+3302+3304), and superimposing an image of the third mask pattern area (3183) on the combined second plus forth mask pattern area (3302+3304), thereby producing a combined second plus third plus forth mask pattern area (3302+3303+3304),
e) alternately superimposing an image of the first mask pattern area (3181) on the combined second plus third plus forth mask pattern area (3302+3303+3304), thereby producing a combined first plus second plus third plus forth mask pattern area (3301+3302+3303+3304), and superimposing an image of the third mask pattern area (3183) on the combined first plus second plus forth mask pattern area (3301+3302+3304), thereby producing further first plus second plus third plus forth mask pattern areas (3301+3302+3303+3304).

13. An illumination system of a microlithographic projection exposure apparatus, comprising
a) a light source (33; 33a, 33b) which is configured to emit a train of successive projection light pulses, the pulse train having an average pulse frequency f>1 kHz,
b) a pupil plane (76),
c) a diffractive optical element (96) comprising a first portion (96a) and a second portion (96b), wherein the first portion (96a) produces, if illuminated by the light pulses, a first irradiance distribution in the pupil plane (76), and wherein the second portion (96b) produces, if illuminated by the light pulses, a second irradiance distribution in the pupil plane (76) which is different from the first irradiance distribution,
d) a drive (104) which is configured to rotate the diffractive optical element (96) around a rotational axis (118), wherein in a first rotational position of the diffractive optical element (96) the first portion (96a) is illuminated by the light pulses, and wherein in a second rotational position of the diffractive optical element, which is different from the first rotational position, the second portion (96b) is illuminated by the light pulses,
e) a control unit (90) that is configured to control the drive (104) and/or the light source (33) such that a change between the first rotational position and the second rotational position takes place between two light pulses of the pulse train, preferably between 5 successive light pulses of the pulse train, and more preferably between two successive light pulses.

14. The illumination system of sentence 13, wherein the drive (104) is configured to rotate the diffractive optical element (96) around the rotational axis (118) with a constant angular velocity, and wherein the control unit (90) is configured to modify the emission time of individual light pulses within a single pulse train by a time shift of at least $1/10 \cdot f$ so that a particular light pulse illuminates, depending on the time shift, either the first (96a) or the second portion (96b) while the diffractive optical element (96) rotates around the rotational axis (118) with constant angular velocity.

15. The illumination system of sentence 14, wherein the rotational frequency of the diffractive optical element is equal to the average pulse frequency f.

16. The illumination system of any of sentences 13 to 15, wherein the drive (104) is configured to rotate the diffractive optical element (96) such that its circumference moves with a tangential velocity of more than 10 m/s.

17. The illumination system of any of sentences 13 to 16, wherein the diffractive optical element (96) comprises a plurality of first portions (96a) and a plurality of second portions (96b), wherein each first portion (96a) produces, if illuminated by the light pulses, a first irradiance distribution in the pupil plane (6), and wherein each second portion (96b) produces, if illuminated by the light pulses, a second irradiance distribution in the pupil plane (76) which is different from the first irradiance distribution, and wherein the first portions (96a) and the second portions (96b) alternate along a circumference of the diffractive optical element (96).

18. The illumination system of any of sentences 13 to 17, wherein the control unit (90) is configured to control the drive (104) and/or the light source (33) such that the first portion (96a) and the second portion (96b) are illuminated by the light pulses during a single rotation of the diffractive optical element (96) by 360°.

19. The illumination system of any of sentences 13 to 18, wherein the first portion (96a) and the second portion (96b) are included in a circular ring (140) which is centered with respect to the rotational axis (118), wherein a diffractive effect produced by the ring (140), if illuminated by the light pulses, changes continuously during a rotation of the diffractive optical element (96).

20. The illumination system of any of sentences 13 to 19, wherein the illumination system (12) comprises a stationary diffractive optical element (96'), which is fixedly arranged such that the irradiance distribution in the pupil plane (96) is at least substantially a convolution of the irradiance distribution produced by the stationary diffractive optical element (96') and the first or the second irradiance distribution produced by the first (96a) and second portion (96b), respectively.

21. The illumination system of sentence 20, wherein the illumination system (12) comprises a first (33a) and a second light source (33b each being configured to emit a train of successive projection light pulses, the pulse train having an average pulse frequency f>1 kHz, and wherein the light pulses produced by the first and second light sources impinge from different directions on one of the diffractive optical elements (96', 96a, 96b).

22. The illumination system of sentence 21, wherein the one diffractive optical element is the stationary diffractive optical element (96').

23. The illumination system of any of sentences 21 to 22, wherein the first (33a) and second light source (33b) are configured to emit light pulses alternately so that an effective pulse train having an average pulse frequency of 2·f is obtained.

24. A method of operating a microlithographic projection exposure apparatus, comprising the following steps:
    a) producing a train of successive projection light pulses with an average pulse frequency f>1 kHz,
    b) simultaneously rotating a diffractive optical element (96) around a rotational axis (118), the diffractive optical element (96) comprising a first portion (96a) and a second portion (96b), wherein the first portion (96a) produces, if illuminated by the light pulses, a first irradiance distribution in a pupil plane (76) of the illumination system (12), and wherein the second portion (96b) produces, if illuminated by the light pulses, a second irradiance distribution in the pupil plane (76) which is different from the first irradiance distribution,
    c) controlling an emission of the light pulses in step a) and/or a rotation of the diffractive optical element (96) in step b) such that one light pulse illuminates the first portion (96a) and another, preferably an immediately successive, light pulse of the same pulse train illuminates the second portion (96b).

25. The method of sentence 24, wherein the diffractive optical element (96) is rotated around the rotational axis (118) with a constant angular velocity, and wherein the emission times of the light pulses are modified within a single pulse train by a time shift of at least ¹⁄₁₀·f so that a particular light pulse illuminates, depending on the time shift, either the first (96a) or the second portion (96b) while the diffractive optical element (96) rotates around the rotational axis (118) with constant angular velocity.

26. The method of sentence 24 or 25, wherein a circumference of the diffractive optical element (96) moves with a tangential velocity of more than 10 m/s.

27. The method of any of sentences 24 to 26, wherein the emission times are controlled such that the first portion (96a) and the second portion (96b) are illuminated alternately during a single pulse train.

28. The method of any of sentences 24 to 27, wherein the light pulses also pass through a stationary diffractive optical element (96') which is fixedly arranged such that the irradiance distribution in the pupil plane (74) is at least substantially a convolution of the irradiance distribution produced by the stationary diffractive optical element (96') and the first or the second irradiance distribution produced by the first (96a) and second portion (96b), respectively.

29. The method of any of sentences 24 to 28, wherein the train of light pulses is produced by a first light source (33a), which emits a first train of successive projection light pulses, and a second light source (33b), which emits a second train of successive projection light pulses, wherein the first train and the second train are interleaved.

30. The method of sentence 29, wherein the first portion is illuminated only be light pulses of the first pulse train, and wherein the second portion is illuminated only be light pulses of the second pulse train.

31. The method of sentence 29 or 30, wherein the first portion and the second portion laterally shift an irradiance distribution, which is produced by the stationary diffractive optical element (96') in the pupil plane (76), along opposite directions.

32. An illumination system of a microlithographic projection exposure apparatus (10), comprising:
    a) an optical integrator (60) comprising an array (70, 72) of optical raster elements (74), wherein a light beam is associated with each optical raster element (74),
    b) a condenser (78) which superimposes the light beams associated with the optical raster elements (74) in a common field plane (80) which is identical to or optically conjugate to a mask plane (88) in which a mask (16) to be illuminated is positioned during operation of the illumination system (12),
    c) a polarization modulator (77) which is configured to modify a field dependency of a state of polarization of projection light in an illuminated field (14), which is illuminated in the mask plane (88) by the illumination system (12).

33. The illumination system of sentence 32, wherein the polarization modulator (77) comprises a plurality of modulator units (79) that
    are arranged in a raster field plane (84), which comprises a plurality of raster field plane elements, wherein each raster field plane element
        is imaged on the entire common field plane (80) and
        is associated in a one to one correspondence with one of the optical raster elements (74), and
    are configured to variably modify the state of polarization of the light beams, which are associated with the optical raster elements (74), differently in at least two portions of each raster field plane element in response to a control signal.

34. The illumination system of sentence 33, comprising a control unit (90) which is capable of controlling the modulator units (79) in such a manner that different states of polarization are present in the illuminated field.

35. The illumination system of sentence 33 or 34, wherein each modulator unit (79) comprises two birefringent optical components (79a, 79b) having a thickness along an optical axis (OA) of the illumination system (12) that is individually variable.

36. The illumination system of sentence 35, wherein each optical component (79a, 79b) comprises two birefringent wedges (84) and a drive (83) which is configured to displace at least one wedge (84).

37. A method of illuminating a mask in a microlithographic projection exposure apparatus (10), comprising the following steps:
    a) illuminating a first mask pattern area (181) with first projection light having a first state of polarization, while the mask (16) moves along a scan direction (Y);
    b) illuminating a second mask pattern area (182), which is arranged on the mask next to the first mask pattern (181) area along a cross scan direction (X) which is perpendicular to the scan direction, with second projection light having a second state of polarization, which is different from the first state of polarization.

38. The method of sentence 37, wherein the first projection light has a first angular light distribution, and wherein the second projection light has a second angular light distribution which is different from the first angular light distribution.

39. The method of sentence 37 or 38, wherein the first state of polarization is changed to a third state of polarization, which is different from the second state of polarization.

40. The method of sentence 39, wherein the first state of polarization is changed to the third state of polarization after a movement of the mask along the scan direction has been terminated.

The invention claimed is:

1. A method of using a mask comprising a first mask pattern area and a second mask pattern area which is different from the first mask pattern area, the method comprising:
   a) directing projection light having a first angular distribution onto the first mask pattern area to produce a first exposed pattern area on a surface of a light sensitive material and directing projection light having a second angular distribution onto the second mask pattern area to produce a second exposed pattern area on the surface of the light sensitive material; and
   b) after a), directing projection light having the first angular distribution through the first mask pattern and on the second exposed pattern area, and simultaneously directing projection light having the second angular distribution through the second mask pattern and on a third exposed pattern area which is different from the first and second exposed pattern areas, and wherein the first angular distribution is different from the second angular distribution.

2. The method of claim 1, wherein a) comprises simultaneously directing the projection light onto first and second mask pattern areas.

3. The method of claim 2, wherein:
   a) comprises moving the mask along a scan direction so that an illuminated field scans over the first and second mask pattern areas; and
   the first and second mask pattern areas are arranged side by side along a direction perpendicular both to the scan direction and a normal to the mask.

4. The method of claim 3, wherein, during a), an image of the second mask pattern area is not superimposed on the first exposure pattern area.

5. The method of claim 4, further comprising, between a) and b), displacing the light sensitive surface along the direction perpendicular to both the scan direction and the normal to the mask.

6. The method of claim 1, wherein a) comprises directing the projection light onto the first mask pattern area and subsequently directing the projection light onto the second mask pattern area.

7. The method of claim 6, wherein:
   a) comprises moving the mask along a scan direction so that an illuminated field scans over the first and second mask pattern areas; and
   the first and second mask pattern areas are arranged one behind the other along the scan direction.

8. The method of claim 7, wherein b) comprises superimposing an image of the second mask pattern area onto the first exposure pattern area.

9. The method of claim 8, further comprising, between a) and b), displacing the light sensitive surface along the scan direction.

10. The method of claim 1, further comprising:
    providing a system, comprising:
      a first light source configured to emit a train of successive projection light pulses, the pulse train having an average pulse frequency that is greater than one kHz;
      a diffractive optical element comprising first and second portions, the diffractive optical element configured so that: i) when the first portion of the diffractive optical element is illuminated by light pulses from the first light source, the first portion produces a first irradiance distribution in a pupil plane of the system; and ii) when the second portion of the diffractive optical element is illuminated by light pulses, the second portion produces a second irradiance distribution in the pupil plane of the system, the second irradiance distribution being different from the first irradiance distribution;
      a drive configured to rotate the diffractive optical element around a rotational axis so that: i) when the diffractive optical element is in a first rotational position, the first portion of the diffractive optical element is illuminated by light pulses from the first light source; and ii) when the diffractive optical element is in a second rotational position, the second portion of the diffractive optical element is illuminated, the second rotational position being different from the first rotational position; and
      a control unit configured to control the drive and/or the first light source so that, during use of the system, a change between the first and second rotational positions takes place between two successive light pulses of the pulse train; and
    using the system to provide the projection light.

11. The method of claim 10, further comprising:
    using the drive to rotate the diffractive optical element around the rotational axis with a constant angular velocity; and
    using the control unit to modify an emission time of individual light pulses within a single pulse train by a time shift of at least one tenth of the average pulse frequency so that a particular light pulse illuminates either the first portion of the diffractive optical element or the second portion of while the diffractive optical element rotates around the rotational axis with constant angular velocity.

12. The method of claim 11, wherein the rotational frequency of the diffractive optical element is equal to the average pulse frequency f.

13. The method of claim 10, further comprising using the drive to rotate the diffractive optical element so that a circumference of the diffractive optical element moves with a tangential velocity of more than 100 meters per second.

14. The method of claim 10, wherein:
    the diffractive optical element comprises a plurality of first portions and a plurality of second portions;
    when each first portion is illuminated by light pulses from the first light source, each first portion produced a first irradiance distribution in the pupil plane;
    when each second portion is illuminated by light pulses from the first light source, each second portion produced a second irradiance distribution in the pupil plane;
    the second irradiance distribution is different from the first irradiance distribution; and
    the first and second portions alternate along a circumference of the diffractive optical element.

15. The method of claim 10, further comprising using the control unit to control the drive and/or the first light source so that the first and second portions are illuminated by light pulses produced by the first light source during a single rotation of the diffractive optical element by 360°.

16. The method of claim 10, wherein:
    the first and second portions are included in a circular ring that is centered with respect to the rotational axis; and when the ring is illuminated by light pulses from the first light source, the ring produces a diffractive effect that changes continuously during a rotation of the diffractive optical element.

17. The method claim 10, further comprising using a stationary diffractive optical element that is fixedly arranged so that the irradiance distribution in the pupil plane is at least substantially a convolution of the irradiance distribution produced by the stationary diffractive optical element and an irradiance distribution selected from the group consisting of the first irradiance distribution and the second irradiance distribution.

18. The method of claim 17, wherein:
the method further comprises using a second light source to emit a train of successive projection light pulses;
the pulse train of the second light source has an average pulse frequency greater than one kHz; and
the light pulses produced by the first and second light sources impinge from different directions on one of the diffractive optical elements.

19. The method of claim 18, wherein the one diffractive optical element is the stationary diffractive optical element.

20. The method of claim 18, wherein the first and second light sources emit light pulses alternately to provide an effective pulse train having an average pulse frequency that is twice the average pulse frequency.

21. The method of claim 1, wherein directing the projection light comprises:
c) producing a train of successive projection light pulses, the pulse train having an average pulse frequency that is greater than one kHz;
d) simultaneously rotating a diffractive optical element around a rotational axis, the diffractive optical element comprising first and second portions configured so that:
i) when the first portion is illuminated by the light pulses, the first portion produces a first irradiance distribution in a pupil plane of an illumination system; and ii) when the second portion is illuminated by the light pulses, the second portion produced a second a second irradiance distribution in the pupil plane, the second irradiance distribution being different from the first irradiance distribution; and
e) controlling an emission of the light pulses in c) and/or a rotation of the diffractive optical element in d) so that one light pulse illuminates the first portion and another immediately successive light pulse of the same pulse train illuminates the second portion.

* * * * *

UNITED STATES PATENT AND TRADEMARK OFFICE
CERTIFICATE OF CORRECTION

| | | |
|---|---|---|
| PATENT NO. | : 9,581,910 B2 | Page 1 of 1 |
| APPLICATION NO. | : 14/747441 | |
| DATED | : February 28, 2017 | |
| INVENTOR(S) | : Frank Schlesener et al. | |

It is certified that error appears in the above-identified patent and that said Letters Patent is hereby corrected as shown below:

On the Title Page

Column 1, Lines 1-2, under "Related U.S. Application Data", delete "PCT/EP2013/201300," and insert -- PCT/EP2013/000118, --.

In the Specification

Column 22, Line 35, delete "66mirrors" and insert -- 6×6 mirrors --.

Column 32, Line 18, delete "secand" and insert -- second --.

In the Claims

Column 47, Line 5, Claim 17, after "method", insert -- of --.

Column 48, Lines 15-16, Claim 21, delete "a second a second" and insert -- a second --.

Signed and Sealed this
Eighteenth Day of July, 2017

Joseph Matal
*Performing the Functions and Duties of the*
*Under Secretary of Commerce for Intellectual Property and*
*Director of the United States Patent and Trademark Office*